(12) United States Patent
Xiao et al.

(10) Patent No.: US 10,050,623 B2
(45) Date of Patent: Aug. 14, 2018

(54) HIGH PERFORMANCE REPEATER

(71) Applicant: Intel Corporation, Santa Clara, CA (US)

(72) Inventors: Kai Xiao, University Place, WA (US); Zuoguo Wu, San Jose, CA (US); Venkatraman Iyer, Austin, TX (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/865,682

(22) Filed: Sep. 25, 2015

(65) Prior Publication Data

US 2017/0019105 A1   Jan. 19, 2017

Related U.S. Application Data

(60) Provisional application No. 62/194,081, filed on Jul. 17, 2015.

(51) Int. Cl.
*H03L 5/00* (2006.01)
*H03K 19/0175* (2006.01)
(Continued)

(52) U.S. Cl.
CPC ..... *H03K 19/017509* (2013.01); *G06F 13/00* (2013.01); *H03K 5/08* (2013.01); *H04L 25/0272* (2013.01)

(58) Field of Classification Search
CPC ........ H03K 5/02; H03K 5/24; H03K 19/0005; H03K 19/017545; H03K 19/01825; H03K 19/018557; H03K 3/2893; G06F 13/4086; G06F 12/1081; G06F 13/28; G06F 3/061; G06F 3/0611; G06F 3/0613; G06F 11/3485; G06F 11/30; G06F 11/3003; G06F 11/3041; G06F 11/3466; G06F 3/0653; G06F 11/3051; G06F 13/4068; G06F 13/4081; H05K 1/0246; H04M 1/82; H04M 19/001; H04M 19/026; H04M 3/005;
(Continued)

(56) References Cited

U.S. PATENT DOCUMENTS 6,715,087 B1   3/2004 Attimont et al.
7,603,486 B2 * 10/2009 Le ..................... H04B 3/50
                                          379/377
(Continued)

FOREIGN PATENT DOCUMENTS

JP   2002258999   9/2002
WO   2017014875   1/2017

OTHER PUBLICATIONS

International Search Report and Written Opinion in International Application No. PCT/US2016/037962 dated Sep. 22, 2016.

*Primary Examiner* — Lincoln Donovan
*Assistant Examiner* — Diana J Cheng
(74) *Attorney, Agent, or Firm* — Alliance IP, LLC

(57) ABSTRACT

A redriver device is provided to receive signals from a first device and forward the signals to a second device on a differential link. Detection circuitry is provided to detect presence of the second device on the link by detecting a pulldown voltage generated from termination of the second device on the link, and pulldown relay circuitry is provided to generate an emulated version of the pulldown voltage of the second device on pins to connect to the first device in response to detecting presence of the second device on the link.

24 Claims, 19 Drawing Sheets

(51) Int. Cl.
*H03K 5/08* (2006.01)
*G06F 13/00* (2006.01)
*H04L 25/02* (2006.01)

(58) Field of Classification Search
CPC .. H04M 3/2272; H04M 3/2281; H04B 1/582; H04B 1/585; H04B 1/586; H04L 12/2602; H04L 43/00; H04L 41/12
USPC ........ 327/306; 326/30; 379/377, 414; 710/7, 710/15, 17
See application file for complete search history.

(56) References Cited

U.S. PATENT DOCUMENTS

| | | |
|---|---|---|
| 9,094,245 B2 * | 7/2015 | Yeung .................. H04B 3/36 |
| 2004/0101133 A1 | 5/2004 | Le et al. |
| 2006/0129733 A1 | 6/2006 | Sobelman |
| 2011/0068632 A1 * | 3/2011 | Du ........................ H02J 4/00 307/75 |
| 2014/0210509 A1 | 7/2014 | Yeung et al. |

* cited by examiner

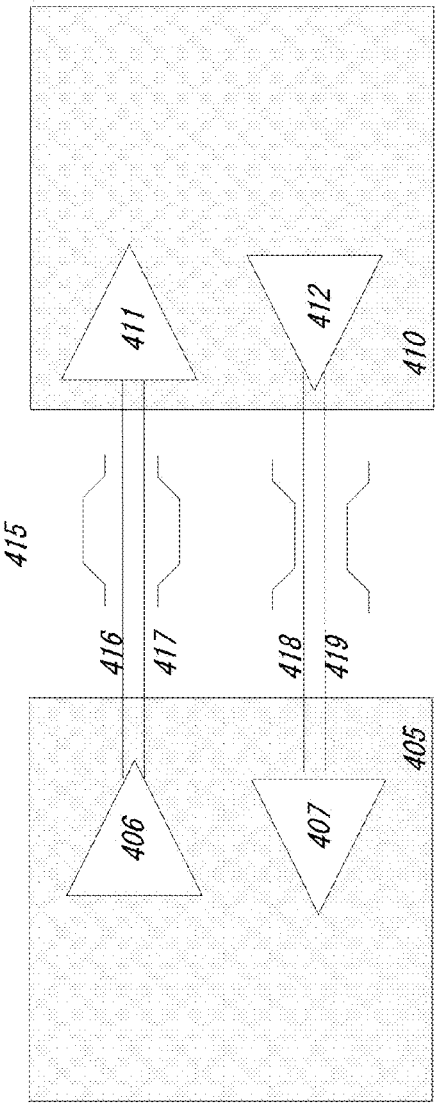

| BYTE | VALUE |
|------|-------|
| 0 | 0x00 |
| 1 | 0xFF |
| 2 | 0x00 |
| 3 | 0xFF |
| 4 | 0x00 |
| 5 | 0xFF |
| 6 | 0x00 |
| 7 | 0xFF |
| 8 | 0x00 |
| 9 | 0xFF |
| 10 | 0x00 |
| 11 | 0xFF |
| 12 | 0x00 |
| 13 | 0xFF |
| 14 | 0x00 |
| 15 | 0xFF |

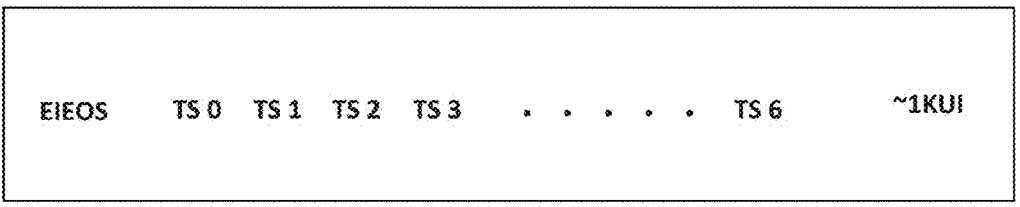
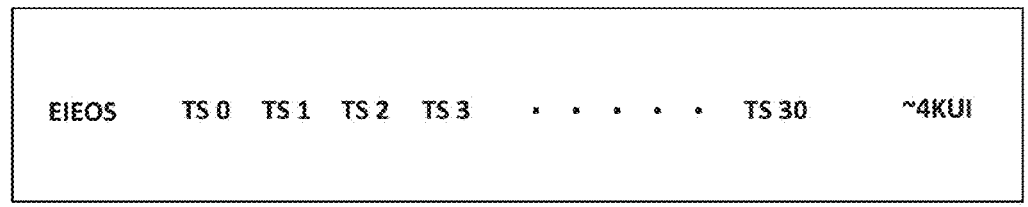
FIG. 9

HIGH PERFORMANCE REPEATER

This application claims benefit to U.S. Provisional Patent Application Ser. No. 62/194,081, filed Jul. 17, 2015 and incorporated by reference herein in its entirety.

FIELD

The present disclosure relates in general to the field of computer development, and more specifically, to repeaters.

BACKGROUND

Advances in semi-conductor processing and logic design have permitted an increase in the amount of logic that may be present on integrated circuit devices. As a corollary, computer system configurations have evolved from a single or multiple integrated circuits in a system to multiple cores, multiple hardware threads, and multiple logical processors present on individual integrated circuits, as well as other interfaces integrated within such processors. A processor or integrated circuit typically comprises a single physical processor die, where the processor die may include any number of cores, hardware threads, logical processors, interfaces, memory, controller hubs, etc.

As a result of the greater ability to fit more processing power in smaller packages, smaller computing devices have increased in popularity. Smartphones, tablets, ultrathin notebooks, and other user equipment have grown exponentially. However, these smaller devices are reliant on servers both for data storage and complex processing that exceeds the form factor. Consequently, the demand in the high-performance computing market (i.e. server space) has also increased. For instance, in modern servers, there is typically not only a single processor with multiple cores, but also multiple physical processors (also referred to as multiple sockets) to increase the computing power. But as the processing power grows along with the number of devices in a computing system, the communication between sockets and other devices becomes more critical.

Signal repeaters and re-driver circuits can be implemented in some systems to compensate for limits on physical channel length. For instance, devices may have a limited drive capability, limiting the distance that signals may be safely driven. Further, some interconnect standards can specify a limit to the physical length of a signal line. A long distance line may be divided into two or more segments, with a buffer or repeater between segments. Repeaters can include retimers and redrivers.

BRIEF DESCRIPTION OF THE DRAWINGS

FIG. 3 illustrates an embodiment of a transaction descriptor.

FIG. 4 illustrates an embodiment of a serial point-to-point link.

FIG. 8 illustrates a representation of an example electrical ordered set.

FIG. 9 illustrates example control supersequences.

Like reference numbers and designations in the various drawings indicate like elements.

DETAILED DESCRIPTION

Figure 1:
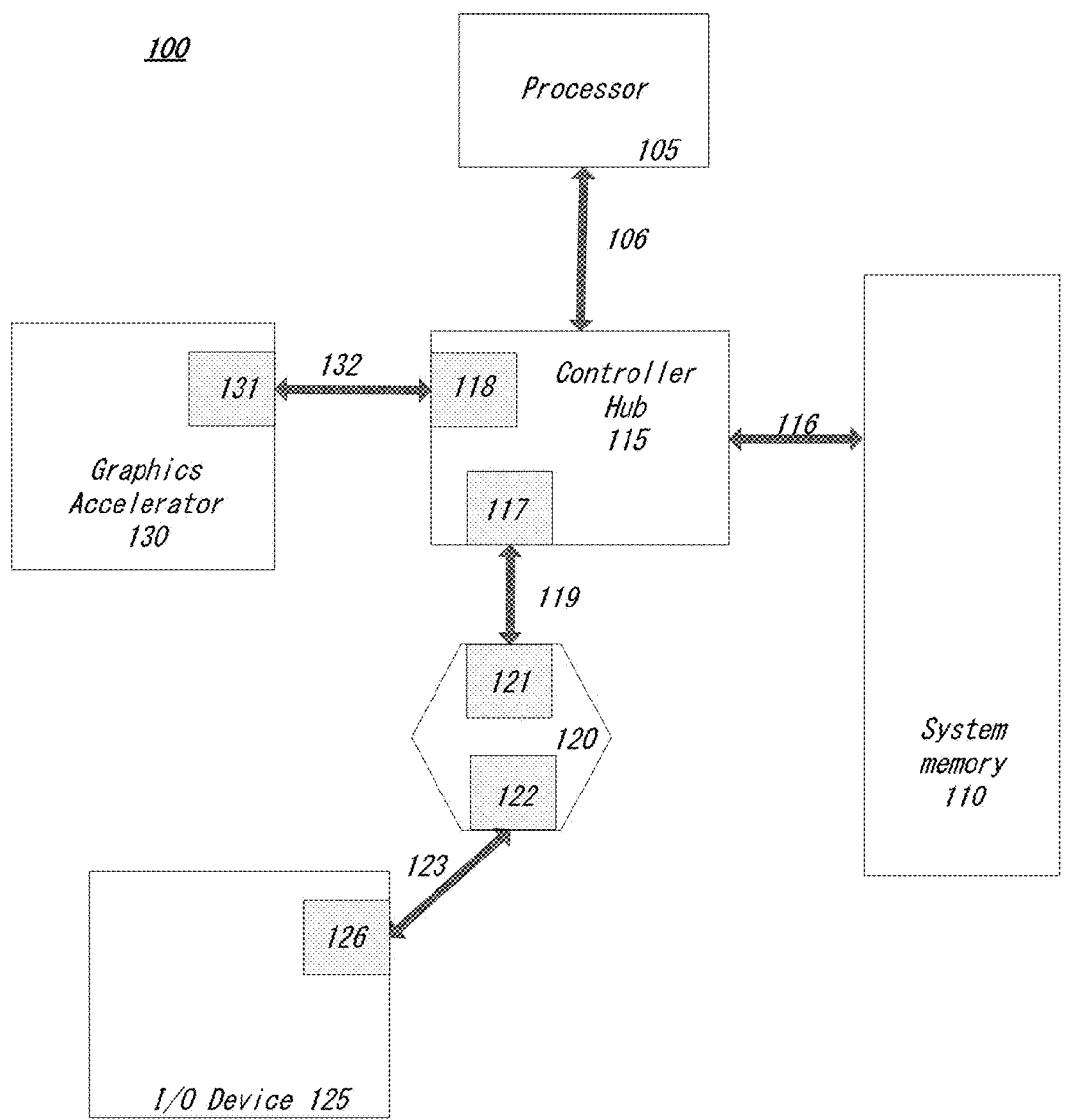
FIG. 1 illustrates a simplified block diagram of a system including a serial point-to-point interconnect to connect I/O devices in a computer system in accordance with one embodiment.

In the following description, numerous specific details are set forth, such as examples of specific types of processors and system configurations, specific hardware structures, specific architectural and micro architectural details, specific register configurations, specific instruction types, specific system components, specific processor pipeline stages, specific interconnect layers, specific packet/transaction configurations, specific transaction names, specific protocol exchanges, specific link widths, specific implementations, and operation etc. in order to provide a thorough understanding of the present disclosure. It may be apparent, however, to one skilled in the art that these specific details need not necessarily be employed to practice the subject matter of the present disclosure. In other instances, well detailed description of known components or methods has been avoided, such as specific and alternative processor architectures, specific logic circuits/code for described algorithms, specific firmware code, low-level interconnect operation, specific logic configurations, specific manufacturing techniques and materials, specific compiler implementations, specific expression of algorithms in code, specific power down and gating techniques/logic and other specific operational details of computer system in order to avoid unnecessarily obscuring the present disclosure.

Although the following embodiments may be described with reference to energy conservation, energy efficiency, processing efficiency, and so on in specific integrated circuits, such as in computing platforms or microprocessors, other embodiments are applicable to other types of integrated circuits and logic devices. Similar techniques and teachings of embodiments described herein may be applied to other types of circuits or semiconductor devices that may also benefit from such features. For example, the disclosed embodiments are not limited to server computer system, desktop computer systems, laptops, Ultrabooks™, but may be also used in other devices, such as handheld devices, smartphones, tablets, other thin notebooks, systems on a chip (SOC) devices, and embedded applications. Some examples of handheld devices include cellular phones, Internet protocol devices, digital cameras, personal digital assistants (PDAs), and handheld PCs. Here, similar techniques for a high-performance interconnect may be applied to increase performance (or even save power) in a low power interconnect. Embedded applications typically include a microcontroller, a digital signal processor (DSP), a system on a chip, network computers (NetPC), set-top boxes, network hubs, wide area network (WAN) switches, or any other system that can perform the functions and operations taught below. Moreover, the apparatus', methods, and systems described herein are not limited to physical computing devices, but may also relate to software optimizations for energy conservation and efficiency. As may become readily apparent in the description below, the embodiments of methods, apparatus', and systems described herein (whether in reference to hardware, firmware, software, or a combination thereof) may be considered vital to a "green technology" future balanced with performance considerations.

As computing systems are advancing, the components therein are becoming more complex. The interconnect architecture to couple and communicate between the components has also increased in complexity to ensure bandwidth demand is met for optimal component operation. Furthermore, different market segments demand different aspects of interconnect architectures to suit the respective market. For example, servers require higher performance, while the mobile ecosystem is sometimes able to sacrifice overall performance for power savings. Yet, it is a singular purpose of most fabrics to provide highest possible performance with maximum power saving. Further, a variety of different interconnects can potentially benefit from subject matter described herein.

The Peripheral Component Interconnect (PCI) Express (PCIe) interconnect fabric architecture and QuickPath Interconnect (QPI) fabric architecture, among other examples, can potentially be improved according to one or more principles described herein, among other examples. For instance, a primary goal of PCIe is to enable components and devices from different vendors to inter-operate in an open architecture, spanning multiple market segments; Clients (Desktops and Mobile), Servers (Standard and Enterprise), and Embedded and Communication devices. PCI Express is a high performance, general purpose I/O interconnect defined for a wide variety of future computing and communication platforms. Some PCI attributes, such as its usage model, load-store architecture, and software interfaces, have been maintained through its revisions, whereas previous parallel bus implementations have been replaced by a highly scalable, fully serial interface. The more recent versions of PCI Express take advantage of advances in point-to-point interconnects, Switch-based technology, and packetized protocol to deliver new levels of performance and features. Power Management, Quality Of Service (QoS), Hot-Plug/Hot-Swap support, Data Integrity, and Error Handling are among some of the advanced features supported by PCI Express. Although the primary discussion herein is in reference to a new high-performance interconnect (UPI) architecture, aspects of the disclosure described herein may be applied to other interconnect architectures, such as a PCIe-compliant architecture, a QPI-compliant architecture, a MIPI compliant architecture, a high-performance architecture, or other known interconnect architecture.

Referring to FIG. 1, an embodiment of a fabric composed of point-to-point Links that interconnect a set of components is illustrated. System 100 includes processor 105 and system memory 110 coupled to controller hub 115. Processor 105 can include any processing element, such as a microprocessor, a host processor, an embedded processor, a co-processor, or other processor. Processor 105 is coupled to controller hub 115 through front-side bus (FSB) 106. In one embodiment, FSB 106 is a serial point-to-point interconnect as described below. In another embodiment, link 106 includes a serial, differential interconnect architecture that is compliant with different interconnect standard. One or more components of the system 100 can be provided with logic to implement the features described herein.

System memory 110 includes any memory device, such as random access memory (RAM), non-volatile (NV) memory, or other memory accessible by devices in system 100. System memory 110 is coupled to controller hub 115 through memory interface 116. Examples of a memory interface include a double-data rate (DDR) memory interface, a dual-channel DDR memory interface, and a dynamic RAM (DRAM) memory interface.

In one embodiment, controller hub 115 can include a root hub, root complex, or root controller, such as in a PCIe interconnection hierarchy. Examples of controller hub 115 include a chipset, a memory controller hub (MCH), a northbridge, an interconnect controller hub (ICH) a southbridge, and a root controller/hub. Often the term chipset refers to two physically separate controller hubs, e.g., a memory controller hub (MCH) coupled to an interconnect controller hub (ICH). Note that current systems often include the MCH integrated with processor 105, while controller 115 is to communicate with I/O devices, in a similar manner as described below. In some embodiments, peer-to-peer routing is optionally supported through root complex 115.

Here, controller hub 115 is coupled to switch/bridge 120 through serial link 119. Input/output modules 117 and 121, which may also be referred to as interfaces/ports 117 and 121, can include/implement a layered protocol stack to provide communication between controller hub 115 and switch 120. In one embodiment, multiple devices are capable of being coupled to switch 120.

Switch/bridge 120 routes packets/messages from device 125 upstream, i.e. up a hierarchy towards a root complex, to controller hub 115 and downstream, i.e. down a hierarchy away from a root controller, from processor 105 or system memory 110 to device 125. Switch 120, in one embodiment, is referred to as a logical assembly of multiple virtual PCI-to-PCI bridge devices. Device 125 includes any internal or external device or component to be coupled to an electronic system, such as an I/O device, a Network Interface Controller (NIC), an add-in card, an audio processor, a network processor, a hard-drive, a storage device, a CD/DVD ROM, a monitor, a printer, a mouse, a keyboard, a router, a portable storage device, a Firewire device, a Universal Serial Bus (USB) device, a scanner, and other input/output devices. Often in the PCIe vernacular, such as device, is referred to as an endpoint. Although not specifically shown, device 125 may include a bridge (e.g., a PCIe to PCI/PCI-X bridge) to support legacy or other versions of devices or interconnect fabrics supported by such devices.

Graphics accelerator 130 can also be coupled to controller hub 115 through serial link 132. In one embodiment, graphics accelerator 130 is coupled to an MCH, which is coupled to an ICH. Switch 120, and accordingly I/O device 125, is then coupled to the ICH. I/O modules 131 and 118 are also to implement a layered protocol stack to communicate between graphics accelerator 130 and controller hub 115. Similar to the MCH discussion above, a graphics controller or the graphics accelerator 130 itself may be integrated in processor 105.

Figure 2:
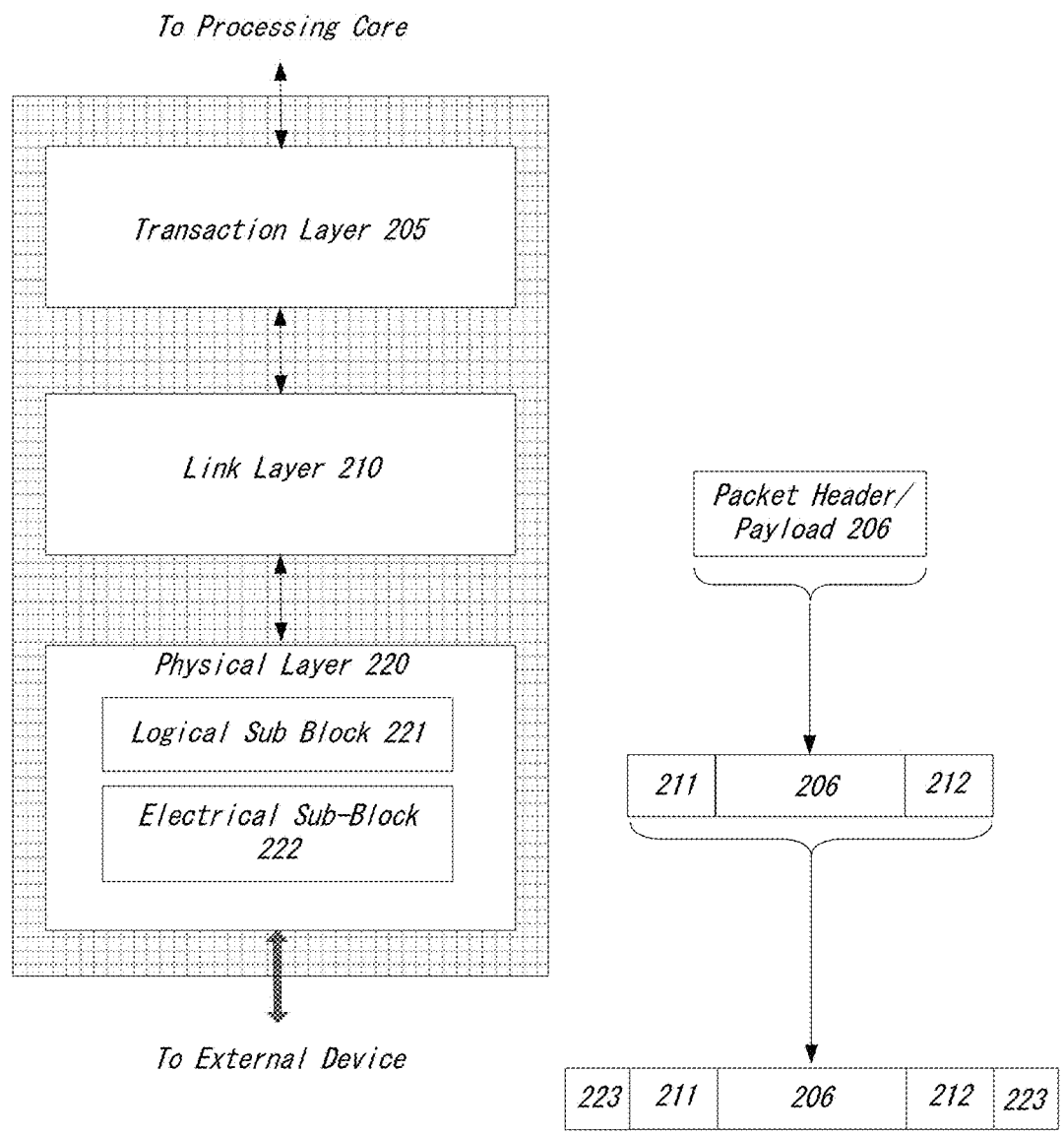
FIG. 2 illustrates a simplified block diagram of a layered protocol stack in accordance with one embodiment.

Turning to FIG. 2 an embodiment of a layered protocol stack is illustrated. Layered protocol stack 200 can includes any form of a layered communication stack, such as a QPI stack, a PCIe stack, a next generation high performance computing interconnect (UPI) stack, or other layered stack. In one embodiment, protocol stack 200 can include transaction layer 205, link layer 210, and physical layer 220. An interface, such as interfaces 117, 118, 121, 122, 126, and 131 in FIG. 1, may be represented as communication protocol stack 200. Representation as a communication protocol stack may also be referred to as a module or interface implementing/including a protocol stack.

Packets can be used to communicate information between components. Packets can be formed in the Transaction Layer 205 and Data Link Layer 210 to carry the information from the transmitting component to the receiving component. As the transmitted packets flow through the other layers, they are extended with additional information used to handle packets at those layers. At the receiving side the reverse process occurs and packets get transformed from their Physical Layer 220 representation to the Data Link Layer 210 representation and finally (for Transaction Layer Packets) to the form that can be processed by the Transaction Layer 205 of the receiving device.

In one embodiment, transaction layer 205 can provide an interface between a device's processing core and the interconnect architecture, such as Data Link Layer 210 and Physical Layer 220. In this regard, a primary responsibility of the transaction layer 205 can include the assembly and disassembly of packets (i.e., transaction layer packets, or TLPs). The translation layer 205 can also manage credit-based flow control for TLPs. In some implementations, split transactions can be utilized, i.e., transactions with request and response separated by time, allowing a link to carry other traffic while the target device gathers data for the response, among other examples.

Credit-based flow control can be used to realize virtual channels and networks utilizing the interconnect fabric. In one example, a device can advertise an initial amount of credits for each of the receive buffers in Transaction Layer 205. An external device at the opposite end of the link, such as controller hub 115 in FIG. 1, can count the number of credits consumed by each TLP. A transaction may be transmitted if the transaction does not exceed a credit limit. Upon receiving a response an amount of credit is restored. One example of an advantage of such a credit scheme is that the latency of credit return does not affect performance, provided that the credit limit is not encountered, among other potential advantages.

In one embodiment, four transaction address spaces can include a configuration address space, a memory address space, an input/output address space, and a message address space. Memory space transactions include one or more of read requests and write requests to transfer data to/from a memory-mapped location. In one embodiment, memory space transactions are capable of using two different address formats, e.g., a short address format, such as a 32-bit address, or a long address format, such as 64-bit address. Configuration space transactions can be used to access configuration space of various devices connected to the interconnect. Transactions to the configuration space can include read requests and write requests. Message space transactions (or, simply messages) can also be defined to support in-band communication between interconnect agents. Therefore, in one example embodiment, transaction layer 205 can assemble packet header/payload 206.

Quickly referring to FIG. 3, an example embodiment of a transaction layer packet descriptor is illustrated. In one embodiment, transaction descriptor 300 can be a mechanism for carrying transaction information. In this regard, transaction descriptor 300 supports identification of transactions in a system. Other potential uses include tracking modifications of default transaction ordering and association of transaction with channels. For instance, transaction descriptor 300 can include global identifier field 302, attributes field 304 and channel identifier field 306. In the illustrated example, global identifier field 302 is depicted comprising local transaction identifier field 308 and source identifier field 310. In one embodiment, global transaction identifier 302 is unique for all outstanding requests.

According to one implementation, local transaction identifier field 308 is a field generated by a requesting agent, and can be unique for all outstanding requests that require a completion for that requesting agent. Furthermore, in this example, source identifier 310 uniquely identifies the requester agent within an interconnect hierarchy. Accordingly, together with source ID 310, local transaction identifier 308 field provides global identification of a transaction within a hierarchy domain.

Attributes field 304 specifies characteristics and relationships of the transaction. In this regard, attributes field 304 is potentially used to provide additional information that allows modification of the default handling of transactions. In one embodiment, attributes field 304 includes priority field 312, reserved field 314, ordering field 316, and no-snoop field 318. Here, priority sub-field 312 may be modified by an initiator to assign a priority to the transaction. Reserved attribute field 314 is left reserved for future, or vendor-defined usage. Possible usage models using priority or security attributes may be implemented using the reserved attribute field.

In this example, ordering attribute field 316 is used to supply optional information conveying the type of ordering that may modify default ordering rules. According to one example implementation, an ordering attribute of "0" denotes default ordering rules are to apply, wherein an ordering attribute of "1" denotes relaxed ordering, wherein writes can pass writes in the same direction, and read completions can pass writes in the same direction. Snoop attribute field 318 is utilized to determine if transactions are snooped. As shown, channel ID Field 306 identifies a channel that a transaction is associated with.

Returning to the discussion of FIG. 2, a Link layer 210, also referred to as data link layer 210, can act as an intermediate stage between transaction layer 205 and the physical layer 220. In one embodiment, a responsibility of the data link layer 210 is providing a reliable mechanism for exchanging Transaction Layer Packets (TLPs) between two components on a link. One side of the Data Link Layer 210 accepts TLPs assembled by the Transaction Layer 205, applies packet sequence identifier 211, i.e. an identification number or packet number, calculates and applies an error detection code, i.e. CRC 212, and submits the modified TLPs to the Physical Layer 220 for transmission across a physical to an external device.

In one example, physical layer 220 includes logical sub block 221 and electrical sub-block 222 to physically transmit a packet to an external device. Here, logical sub-block 221 is responsible for the "digital" functions of Physical Layer 221. In this regard, the logical sub-block can include a transmit section to prepare outgoing information for transmission by physical sub-block 222, and a receiver section to identify and prepare received information before passing it to the Link Layer 210.

Physical block 222 includes a transmitter and a receiver. The transmitter is supplied by logical sub-block 221 with symbols, which the transmitter serializes and transmits onto to an external device. The receiver is supplied with serialized symbols from an external device and transforms the received signals into a bit-stream. The bit-stream is de-serialized and supplied to logical sub-block 221. In one example embodiment, an 8 b/10 b transmission code is employed, where ten-bit symbols are transmitted/received. Here, special symbols are used to frame a packet with frames 223. In addition, in one example, the receiver also provides a symbol clock recovered from the incoming serial stream.

As stated above, although transaction layer 205, link layer 210, and physical layer 220 are discussed in reference to a specific embodiment of a protocol stack (such as a PCIe protocol stack), a layered protocol stack is not so limited. In fact, any layered protocol may be included/implemented and adopt features discussed herein. As an example, a port/interface that is represented as a layered protocol can include: (1) a first layer to assemble packets, i.e. a transaction layer; a second layer to sequence packets, i.e. a link layer; and a third layer to transmit the packets, i.e. a physical layer. As a specific example, a high performance interconnect layered protocol, as described herein, is utilized.

Referring next to FIG. 4, an example embodiment of a serial point to point fabric is illustrated. A serial point-to-point link can include any transmission path for transmitting serial data. In the embodiment shown, a link can include two, low-voltage, differentially driven signal pairs: a transmit pair 406/411 and a receive pair 412/407. Accordingly, device 405 includes transmission logic 406 to transmit data to device 410 and receiving logic 407 to receive data from device 410. In other words, two transmitting paths, i.e. paths 416 and 417, and two receiving paths, i.e. paths 418 and 419, are included in some implementations of a link.

A transmission path refers to any path for transmitting data, such as a transmission line, a copper line, an optical line, a wireless communication channel, an infrared communication link, or other communication path. A connection between two devices, such as device 405 and device 410, is referred to as a link, such as link 415. A link may support one lane—each lane representing a set of differential signal pairs (one pair for transmission, one pair for reception). To scale bandwidth, a link may aggregate multiple lanes denoted by xN, where N is any supported link width, such as 1, 2, 4, 8, 12, 16, 32, 64, or wider.

A differential pair can refer to two transmission paths, such as lines 416 and 417, to transmit differential signals. As an example, when line 416 toggles from a low voltage level to a high voltage level, i.e. a rising edge, line 417 drives from a high logic level to a low logic level, i.e. a falling edge. Differential signals potentially demonstrate better electrical characteristics, such as better signal integrity, i.e. cross-coupling, voltage overshoot/undershoot, ringing, among other example advantages. This allows for a better timing window, which enables faster transmission frequencies.

In one embodiment, a high performance interconnect such as UPI can be provided. UPI can include a next-generation cache-coherent, link-based interconnect. As one example, UPI may be utilized in high performance computing platforms, such as workstations or servers, including in systems where PCIe or another interconnect protocol is typically used to connect processors, accelerators, I/O devices, and the like. However, UPI is not so limited. Instead, UPI may be utilized in any of the systems or platforms described herein. Furthermore, the individual ideas developed may be applied to other interconnects and platforms, such as PCIe, MIPI, QPI, etc.

Figure 5:
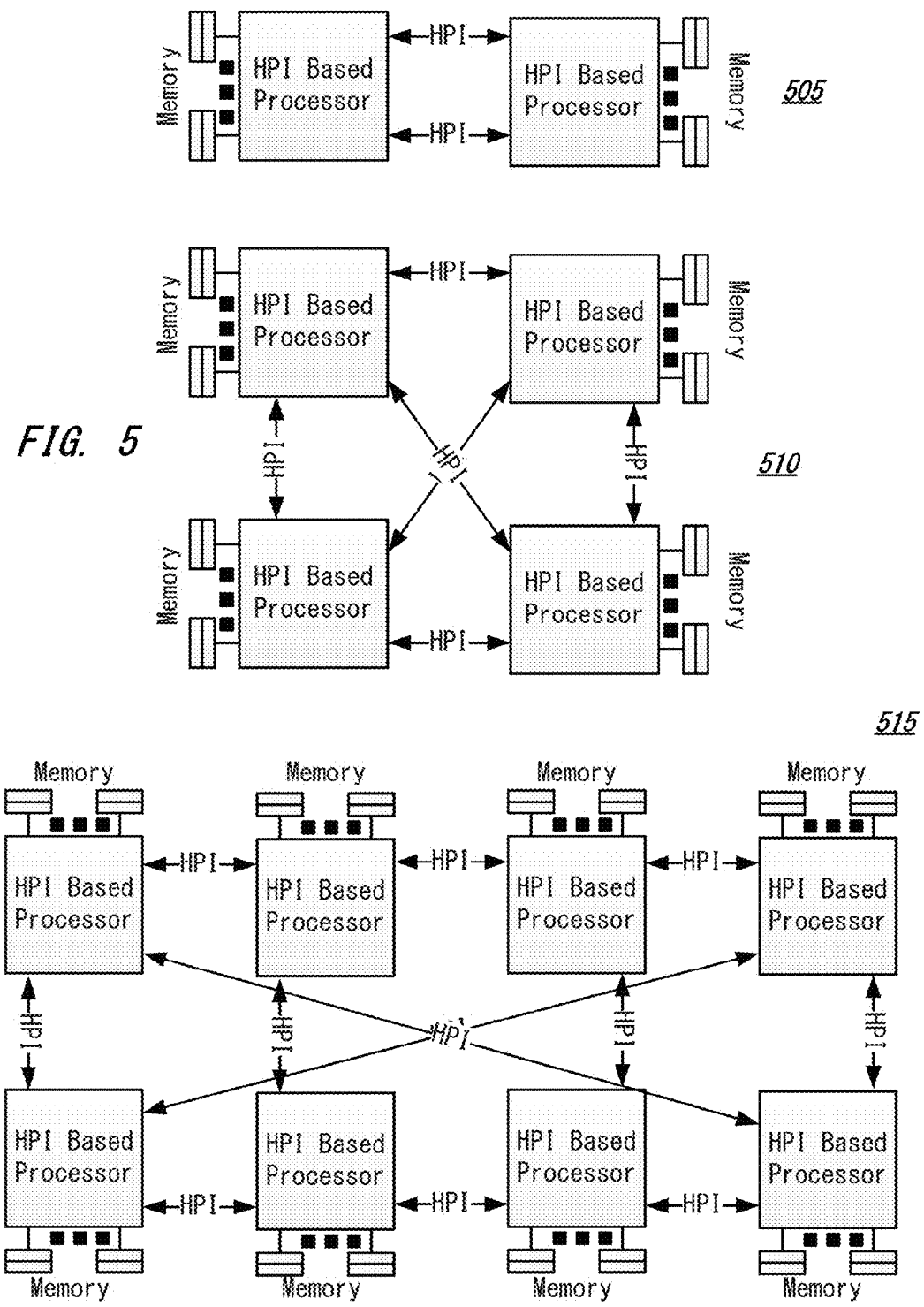
FIG. 5 illustrates embodiments of potential High Performance Interconnect (UPI) system configurations.

To support multiple devices, in one example implementation, UPI can include an Instruction Set Architecture (ISA) agnostic (i.e. UPI is able to be implemented in multiple different devices). In another scenario, UPI may also be utilized to connect high performance I/O devices, not just processors or accelerators. For example, a high performance PCIe device may be coupled to UPI through an appropriate translation bridge (i.e. UPI to PCIe). Moreover, the UPI links may be utilized by many UPI based devices, such as processors, in various ways (e.g. stars, rings, meshes, etc.). FIG. 5 illustrates example implementations of multiple potential multi-socket configurations. A two-socket configuration 505, as depicted, can include two UPI links; however, in other implementations, one UPI link may be utilized. For larger topologies, any configuration may be utilized as long as an identifier (ID) is assignable and there is some form of virtual path, among other additional or substitute features. As shown, in one example, a four socket configuration 510 has an UPI link from each processor to another. But in the eight socket implementation shown in configuration 515, not every socket is directly connected to each other through an UPI link. However, if a virtual path or channel exists between the processors, the configuration is supported. A range of supported processors includes 2-32 in a native domain. Higher numbers of processors may be reached through use of multiple domains or other interconnects between node controllers, among other examples.

Figure 6:
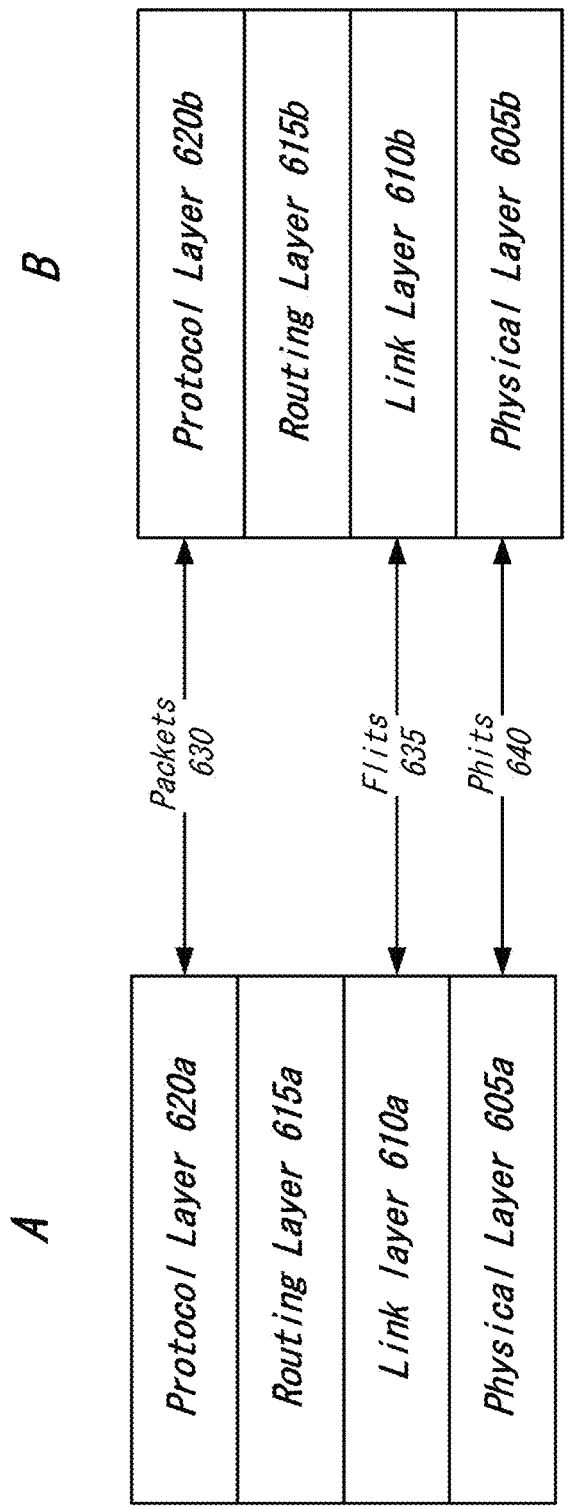
FIG. 6 illustrates an embodiment of a layered protocol stack associated with UPI.

The UPI architecture includes a definition of a layered protocol architecture, including in some examples, protocol layers (coherent, non-coherent, and, optionally, other memory based protocols), a routing layer, a link layer, and a physical layer. Furthermore, UPI can further include enhancements related to power managers (such as power control units (PCUs)), design for test and debug (DFT), fault handling, registers, security, among other examples. FIG. 6 illustrates an embodiment of an example UPI layered protocol stack. In some implementations, at least some of the layers illustrated in FIG. 6 may be optional. Each layer deals with its own level of granularity or quantum of information (the protocol layer 605a,b with packets 630, link layer 610a,b with flits 635, and physical layer 605a,b with phits 640). Note that a packet, in some embodiments, may include partial flits, a single flit, or multiple flits based on the implementation.

As a first example, a width of a phit 640 includes a 1 to 1 mapping of link width to bits (e.g. 20 bit link width includes a phit of 20 bits, etc.). Flits may have a greater size, such as 184, 192, or 200 bits. Note that if phit 640 is 20 bits wide and the size of flit 635 is 184 bits then it takes a fractional number of phits 640 to transmit one flit 635 (e.g. 9.2 phits at 20 bits to transmit an 184 bit flit 635 or 9.6 at 20 bits to transmit a 192 bit flit, among other examples). Note that widths of the fundamental link at the physical layer may vary. For example, the number of lanes per direction may include 2, 4, 6, 8, 10, 12, 14, 16, 18, 20, 22, 24, etc. In one embodiment, link layer 610a,b is capable of embedding multiple pieces of different transactions in a single flit, and one or multiple headers (e.g. 1, 2, 3, 4) may be embedded within the flit. In one example, UPI splits the headers into corresponding slots to enable multiple messages in the flit destined for different nodes.

Physical layer 605a,b, in one embodiment, can be responsible for the fast transfer of information on the physical medium (electrical or optical etc.). The physical link can be point-to-point between two Link layer entities, such as layer 605a and 605b. The Link layer 610a,b can abstract the Physical layer 605a,b from the upper layers and provides the capability to reliably transfer data (as well as requests) and manage flow control between two directly connected entities. The Link Layer can also be responsible for virtualizing the physical channel into multiple virtual channels and message classes. The Protocol layer 620a,b relies on the Link layer 610a,b to map protocol messages into the appropriate message classes and virtual channels before handing them to the Physical layer 605a,b for transfer across the physical links. Link layer 610a,b may support multiple messages, such as a request, snoop, response, writeback, non-coherent data, among other examples.

The Physical layer 605a,b (or PHY) of UPI can be implemented above the electrical layer (i.e. electrical conductors connecting two components) and below the link layer 610a,b, as illustrated in FIG. 6. The Physical layer and corresponding logic can reside on each agent and connects the link layers on two agents (A and B) separated from each other (e.g. on devices on either side of a link). The local and remote electrical layers are connected by physical media (e.g. wires, conductors, optical, etc.). The Physical layer 605a,b, in one embodiment, has two major phases, initialization and operation. During initialization, the connection is opaque to the link layer and signaling may involve a combination of timed states and handshake events. During operation, the connection is transparent to the link layer and signaling is at a speed, with all lanes operating together as a single link. During the operation phase, the Physical layer transports flits from agent A to agent B and from agent B to agent A. The connection is also referred to as a link and abstracts some physical aspects including media, width and speed from the link layers while exchanging flits and control/status of current configuration (e.g. width) with the link layer. The initialization phase includes minor phases e.g. Polling, Configuration. The operation phase also includes minor phases (e.g. link power management states).

In one embodiment, Link layer 610a,b can be implemented so as to provide reliable data transfer between two protocol or routing entities. The Link layer can abstract Physical layer 605a,b from the Protocol layer 620a,b, and can be responsible for the flow control between two protocol agents (A, B), and provide virtual channel services to the Protocol layer (Message Classes) and Routing layer (Virtual Networks). The interface between the Protocol layer 620a,b and the Link Layer 610a,b can typically be at the packet level. In one embodiment, the smallest transfer unit at the Link Layer is referred to as a flit which a specified number of bits, such as 192 bits or some other denomination. The Link Layer 610a,b relies on the Physical layer 605a,b to frame the Physical layer's 605a,b unit of transfer (phit) into the Link Layer's 610a,b unit of transfer (flit). In addition, the Link Layer 610a,b may be logically broken into two parts, a sender and a receiver. A sender/receiver pair on one entity may be connected to a receiver/sender pair on another entity. Flow Control is often performed on both a flit and a packet basis. Error detection and correction is also potentially performed on a flit level basis.

In one embodiment, Routing layer 615a,b can provide a flexible and distributed method to route UPI transactions from a source to a destination. The scheme is flexible since routing algorithms for multiple topologies may be specified through programmable routing tables at each router (the programming in one embodiment is performed by firmware, software, or a combination thereof). The routing functionality may be distributed; the routing may be done through a series of routing steps, with each routing step being defined through a lookup of a table at either the source, intermediate, or destination routers. The lookup at a source may be used to inject a UPI packet into the UPI fabric. The lookup at an intermediate router may be used to route an UPI packet from an input port to an output port. The lookup at a destination port may be used to target the destination UPI protocol agent. Note that the Routing layer, in some implementations, can be thin since the routing tables, and, hence the routing algorithms, are not specifically defined by specification. This allows for flexibility and a variety of usage models, including flexible platform architectural topologies to be defined by the system implementation. The Routing layer 615a,b relies on the Link layer 610a,b for providing the use of up to three (or more) virtual networks (VNs)—in one example, two deadlock-free VNs, VN0 and VN1 with several message classes defined in each virtual network. A shared adaptive virtual network (VNA) may be defined in the Link layer, but this adaptive network may not be exposed directly in routing concepts, since each message class and virtual network may have dedicated resources and guaranteed forward progress, among other features and examples.

In one embodiment, UPI can include a Coherence Protocol layer 620a,b to support agents caching lines of data from memory. An agent wishing to cache memory data may use the coherence protocol to read the line of data to load into its cache. An agent wishing to modify a line of data in its cache may use the coherence protocol to acquire ownership of the line before modifying the data. After modifying a line, an agent may follow protocol requirements of keeping it in its cache until it either writes the line back to memory or includes the line in a response to an external request. Lastly, an agent may fulfill external requests to invalidate a line in its cache. The protocol ensures coherency of the data by dictating the rules all caching agents may follow. It also provides the means for agents without caches to coherently read and write memory data.

Two conditions may be enforced to support transactions utilizing the UPI Coherence Protocol. First, the protocol can maintain data consistency, as an example, on a per-address basis, among data in agents' caches and between those data and the data in memory. Informally, data consistency may refer to each valid line of data in an agent's cache representing a most up-to-date value of the data and data transmitted in a coherence protocol packet can represent the most up-to-date value of the data at the time it was sent. When no valid copy of the data exists in caches or in transmission, the protocol may ensure the most up-to-date value of the data resides in memory. Second, the protocol can provide well-defined commitment points for requests. Commitment points for reads may indicate when the data is usable; and for writes they may indicate when the written data is globally observable and will be loaded by subsequent reads. The protocol may support these commitment points for both cacheable and uncacheable (UC) requests in the coherent memory space.

In some implementations, UPI can utilize an embedded clock. A clock signal can be embedded in data transmitted using the interconnect. With the clock signal embedded in the data, distinct and dedicated clock lanes can be omitted. This can be useful, for instance, as it can allow more pins of a device to be dedicated to data transfer, particularly in systems where space for pins is at a premium.

Physical Layer

A link can be established between two agents on either side of an interconnect. An agent sending data can be a local agent and the agent receiving the data can be a remote agent. State machines can be employed by both agents to manage various aspects of the link. In one embodiment, the Physical layer datapath can transmit flits from the link layer to the electrical front-end. The control path, in one implementation, includes a state machine (also referred to as a link training state machine or the similar). The state machine's actions and exits from states may depend on internal signals, timers, external signals or other information. In fact, some of the states, such as a few initialization states, may have timers to provide a timeout value to exit a state. Note that detect, in some embodiments, refers to detecting an event on both legs of a lane; but not necessarily simultaneously. However, in other embodiments, detect refers to detection of an event by an agent of reference. Debounce, as one example, refers to sustained assertion of a signal. In one embodiment, UPI supports operation in the event of non-function lanes. Here, lanes may be dropped at specific states.

States defined in the state machine can include reset states, initialization states, and operational states, among other categories and subcategories. In one example, some initialization states can have a secondary timer which is used to exit the state on a timeout (essentially an abort due to failure to make progress in the state). An abort may include updating of registers, such as status register. Some states can also have primary timer(s) which are used to time the primary functions in the state. Other states can be defined such that internal or external signals (such as handshake protocols) drive transition from the state to another state, among other examples.

A state machine may also support debug through single step, freeze on initialization abort and use of testers. Here, state exits can be postponed/held until the debug software is ready. In some instance, the exit can be postponed/held until the secondary timeout. Actions and exits, in one embodiment, can be based on exchange of training sequences. In one embodiment, the link state machine is to run in the local agent clock domain and transition from one state to the next is to coincide with a transmitter training sequence boundary. Status registers may be utilized to reflect the current state.

Figure 7:
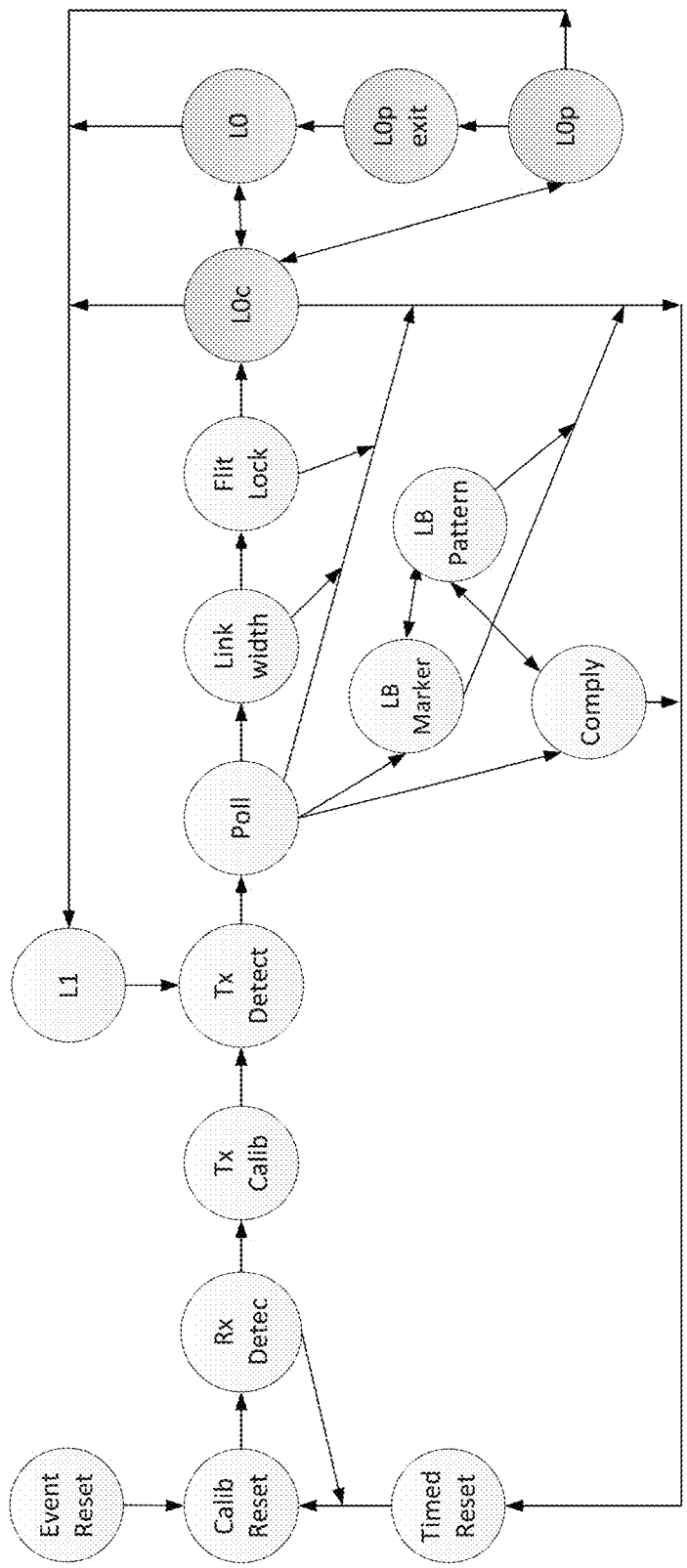
FIG. 7 illustrates a representation of an example state machine.

FIG. 7 illustrates a representation of at least a portion of a state machine used by agents in one example implementation of UPI. It should be appreciated that the states included in the state table of FIG. 7 include a non-exhaustive listing of possible states. For instance, some transitions are omitted to simplify the diagram. Also, some states may be combined, split, or omitted, while others might be added. Such states can include:

Event reset state: entered on a warm or cold reset event. Restores default values. Initialize counters (e.g., sync counters). May exit to another state, such as another reset state.

Timed reset state: timed state for in-band reset. May drive a predefined electrical ordered set (EOS) so remote receivers are capable of detecting the EOS and entering the timed reset as well. Receiver has lanes holding electrical settings. May exit to an agent to calibrate reset state.

Calibrate reset state: calibration without signaling on the lane (e.g. receiver calibration state) or turning drivers off. May be a predetermined amount of time in the state based on a timer. May set an operational speed. May act as a wait state when a port is not enabled. May include minimum residency time. Receiver conditioning or staggering off may occur based on design. May exit to a receiver detect state after a timeout and/or completion of calibration.

Receiver detect state: detect presence of a receiver on lane(s). May look for receiver termination (e.g., receiver pulldown insertion). May exit to calibrate reset state upon a specified value being set or when another specified value is not set. May exit to transmitter calibrate state if a receiver is detected or a timeout is reached.

Transmitter calibrate state: for transmitter calibrations. May be a timed state allocated for transmitter calibrations. May include signaling on a lane. May continuously drive an EOS, such as an electric idle exit ordered set (or EIEIOS). May exit to compliance state when done calibrating or on expiration of a timer. May exit to transmitter detect state if a counter has expired or a secondary timeout has occurred.

Transmitter detect state: qualifies valid signaling. May be a handshake state where an agent completes actions and exits to a next state based on remote agent signaling. Receiver may qualify valid signaling from transmitter. Receiver, in one embodiment, looks for a wake detect, and if debounced on one or more lanes looks for it on the other lanes. Transmitter drives a detect signal. May exit to a polling state in response to debounce being completed for all lanes and/or a timeout or if debounce on all lanes is not complete and there is a timeout. Here, one or more monitor lanes may be kept awake to debounce a wake signal. And if debounced then the other lanes are potentially debounced. This can enable power savings in low power states.

Polling state: receiver adapts, initializes drift buffer and locks on bits/bytes (e.g. identifies symbol boundaries). Lanes may be deskewed. A remote agent may cause an exit to a next state (e.g. a Link Width State) in response to an acknowledge message. Polling can additionally include a training sequence lock by locking to an EOS and a training sequence header. Lane to lane skew at remote transmitter may be capped at a first length for top speed and a second length for slow speed. Deskew may be performed in a slow mode as well as an operational mode. Receiver may have a specific maximum to deskew lane-to-lane skew, such as 8, 16, or 32 intervals of skew. Receiver actions may include latency fixing. Receiver actions, in one embodiment, can be completed on successful deskew of a valid lane map. A successful handshake can be achieved, in one example, when a number of consecutive training sequence headers are received with acknowledgements and a number of training sequences with an acknowledge are transmitted after the receiver has completed its actions.

Link width state: agent communicates with the final lane map to remote transmitter. Receiver receives the information and decodes. Receiver may record a configured lane map in a structure after checkpoint of a previous lane map value in a second structure. Receiver may also respond with an acknowledge ("ACK"). May initiate an in-band reset. As one example, first state to initiate in-band reset. In one embodiment, exit to a next state, such as flit configuration state, is performed in response to the ACK. Further, prior to entering low power state, a reset signal may also be generated if the frequency of a wake detect signal occurrence drops below a specified value (e.g. 1 every number of unit intervals (UIs), such as 4K UI). Receiver may hold current and previous lane maps. Transmitter may use different groups of lanes based on training sequences having different values. Lane map may not modify some status registers in some embodiments.

Flitlock configuration state: entered by a transmitter but the state is considered exited (i.e. secondary timeout moot) when both transmitter and receiver have exited to a blocking link state or other link state. Transmitter exit to a link state, in one embodiment, includes start of a data sequence (SDS) and training sequence (TS) boundary after receiving a planetary alignment signal. Here, receiver exit may be based on receiving an SDS from a remote transmitter. This state may be a bridge from agent to link state. Receiver identifies SDS. Receiver may exit to blocking link state (BLS) (or a control window) if SDS received after a descrambler is initialized. If a timeout occurs, exit may be to reset state. Transmitter drives lanes with a configuration signal. Transmitter exit may be to reset, BLS, or other states based on conditions or timeouts.

Compliance state: entered from the Transmitter calibrate state. One device (acting as master) can send a compliance pattern to another device (slave) and the slave can loop back the pattern after re-timing it to its local clock. Can be used to characterize operation of the analog front end on some subset of lanes when loopback is not functional. Compliance state may be utilized for jitter or noise investigation, debug, exploring a link, etc. The Compliance state can drive a supersequence with a transmitter from the master. Receiver looks for a wake on a monitor lane, debounces the wake, drops bad lanes, adapts, and bit locks, etc. The slave transmitter can drive the compliance pattern until its receiver actions are complete. Then loop-back is re-timed and non-deskewed. Slave receiver does similar monitor and debounce, etc. actions. Exit may be to a reset state, such as a timed reset, or to a loopback pattern state to start the test, among other examples.

Agent Loopback Marker State: Loopback marker is an agent state but unlike other agent states master and slave actions and exits may be different. Loopback slave may undo any polarity inversion and/or lane reversal but may not descramble or rescramble looped back bits. Acknowledgment exchange may not apply to slave since it is looping back. Since slave may deskew before looping back on symbol boundary, master may not be forced to re-bytelock or re-deskew but the master may re-lock training sequence to avoid locking to some alias. Means to do this may include re-seeding of LFSR, comparing TS and/or EIEOS or some combination of these. The end of the SDS marks the end of loopback setup and the start of pattern generation, checking and counting.

Agent Loopback Pattern State (or Block Link state): In this state, instead of control patterns, a master transmitter can send a IBIST pattern and its receiver can check for errors in received pattern. For transmitter adaptation both agents can be masters. For a predetermined period, the transmitter can sends a pattern and a remote receiver can compare this pattern and determine a figure of merit or metric for the received pattern which is recorded in a storage element, such as a register. The comparison method and metric may be design dependent (e.g., BER with jitter injection). At the end of the period, both agents can exit to Reset for the back-channel to examine the metric and set up the next iteration of transmitter adaptation.

Transmitting Link State: a link state. Flits are sent to a remote agent. May be entered from a blocking link state and return to a blocking link state on an event, such as a timeout. Transmitter transmits flits. Receiver receives flits. May also exit to a low power link state. In some implementations, transmitting link state (TLS) can be referred to as the L0 state.

Blocking Link State: a link state. Transmitter and receiver are operating in a unified manner. May be a timed state during which the link layer flits are held off while the Physical layer information is communicated to the remote agent. May exit to a low power link state (or other link state based on the design). A blocking link state (BLS), in one embodiment, periodically occurs. The period is referred to as a BLS interval and may be timed, as well as may differ between slow speed and operational speed. Note that the link layer may be periodically blocked from sending flits so that a Physical layer control sequence of a length may be sent, such as during a transmitting link state or a partial width transmitting link state. In some implementations, blocking link state (BLS) can be referred to as a L0 control, or L0c, state.

Partial Width Transmitting Link State: Link state. May save power by entering a partial width state where one or more available lanes of a link are made idle during the partial width transmitting link state. In one embodiment asymmetric partial width refers to each direction of a two direction link having different widths, which may be supported in some designs. Note that speeds may not be altered but width may be. Therefore, flits are potentially sent at different widths. May be similar to a transmitting link state logically; yet, since there is a smaller width, it may take longer to transmit flits. May exit to other link states, such as a low power link state based on certain received and sent messages or an exit of the partial width transmitting link state or a link blocking state based on other events. In one embodiment, a transmitter port may turn idle lanes off in a staggered manner to provide better signal integrity (i.e. noise mitigation) as shown in the timing diagram. Here, non-retryable flits, such as Null flits, may be utilized during periods where the link width is changing. A corresponding receiver may drop these null flits and turn idle lanes off in a staggered manner, as well as record the current and previous lane maps in one or more structures. Note status and associated status register may remain unaltered. In some implementations, partial width transmitting link state can be referred to as a partial L0, or L0p, state.

Exit Partial Width Transmitting Link State: exit the partial width state. May or may not use a blocking link state in some implementations. The transmitter initiates exit, in one embodiment, by sending partial width exit patterns on the idle lanes to train and deskew them. As one example, an exit pattern start with EIEOS, which is detected and debounced to signal that the lane is ready to start the entry to a full transmitting link state, and may end with SDS or Fast Training Sequence (FTS) on idle lanes. Any failure during the exit sequence (receiver actions, such as deskew not completed prior to timeout) stops flit transfers to the link layer and asserts a reset, which is handled by resetting the link on the next blocking link state occurrence. The SDS may also initialize the scrambler/descrambler on the lanes to appropriate values.

Low Power Link State: is a lower power state. In one embodiment, it is lower power than the partial width link state, since signaling in this embodiment is stopped on all lanes and in both directions. Transmitters may use a blocking link state for requesting a low power link state. Here, receiver may decode the request and respond with an ACK or a NAK; otherwise reset may be triggered. In some implementations, low power link state can be referred to as a L1 state.

In some implementations of UPI, supersequences can be defined, each supersequence corresponding to a respective state or entry/exit to/from the respective state. A supersequence can include a repeating sequence of data sets and symbols. The sequences can repeat, in some instances, until completion of a state or state transition, or communication of a corresponding event, among other examples. In some instances, the repeating sequence of a supersequence can repeat according to a defined frequency, such as a defined number of unit intervals (UIs). A unit interval (UI) can correspond to the interval of time for transmitting a single bit on a lane of a link or system. In some implementations, the repeating sequence can begin with an electrically ordered set (EOS). Accordingly, an instance of the EOS can be expected to repeat in accordance with the predefined frequency. Such ordered sets can be implemented as defined 16 Byte codes that may be represented in hexadecimal format, among other examples. In one example, the EOS of a supersequence can be an EIEIOS, such as represented in FIG. 8. For instance, an EIEIOS can resemble a low frequency clock signal (e.g., a predefined number of repeating FF00 or FFF000 hexadecimal symbols, etc.). A predefined set of data can follow the EOS, such as a predefined number of training sequences or other data. Such supersequences (e.g., those illustrated and disclosed above) can be utilized in state transitions including link state transitions as well as initialization, among other examples.

In some implementations of an interconnect, terminations of a serial data link can be brought on and off, such as when a link is reset or initialized. This approach can introduce complexity and time into the initialization of a link. In some implementations of UPI, terminations of the link can be maintained including during a reset or re-initialization of the link. Further, UPI can permit hot-plugging of devices. When another device is introduced, either through hot-plugging or otherwise, the voltage characteristics of the lane on which the new remote agent is added will change. The local agent can sense these changes (e.g., pulldowns) in the lane voltage to detect the presence of the remote agent and prompt initialization of the link. State machine states and timers can be defined in the state machine to coordinate the detection, configuration, and initialization of a link without terminations.

As an example (e.g., as in FIG. 11), a transmitter of a device, during a receiver detect ("RxDetect") state, can monitor lanes of a link for the presence of a remote receiver termination, which indicates the presence of a remote device on the other end of the link. This can serve as a type of handshake, where the receiver termination causes an exit to the next state (e.g., a Transmitter calibration state). If the handshake does not occur within a predefined time, the monitoring device can abort the initialization, causing a transition back to a reset state before re-entering the RxDetect state to attempt again to identify introduction of a remote device on the link (e.g., in connection with a hot plug event or controlled link bring-up initiated by software, among other examples). During RxDetect, receiver terminations (pulldowns) are to be inserted on all good lanes. Any bad lanes may be dropped before exiting the state and transitioning to another where a detect supersequence is communicated between the devices on the link. Further, the signal generated by the receiver termination can be debounced in that the lanes are checked for a sustained assertion of the signal. In one example, debounce can occur for a period corresponding to the predefined time for monitoring the link during the RxDetect state and may be a multiple of the predefined time, among other examples.

In one implementation, UPI can support re-initialization on an in-band reset without changing the termination values through the screening of a lane by the receiving agent for incoming signaling. The signaling can be used to identify good lanes. As an example, the lane can be screened for any one of a set of pre-defined signals that are to be sent by a transmitter device to facilitate discovery and configuration of the link. In one example, a supersequence can be defined corresponding to one or more initialization or re-initialization tasks. The pre-defined sequence can include an EIEOS followed by additional sequence data. In some instances, as each device on either side of a lane becomes active, the devices can begin sending a supersequence corresponding to a particular initialization state, etc. In one embodiment, two types of pin resets can be supported; power-on (or "cold") reset and warm reset. A reset initiated by software or originating (in the Physical or another layer) on one agent may be communicated in-band to the other agent. However, due to usage of an embedded clock, an in-band reset may be handled by communication to another agent using an ordered set, such as a specific electrical ordered set or EIOS.

The ordered set can be sent during initialization and a PHY control sequence (or "blocking link state") can be sent after initialization. The block link state can block the link layer from sending flits. As another example, link layer traffic may be blocked to send a few NULL flits which may be discarded at the receiver.

Figure 10:
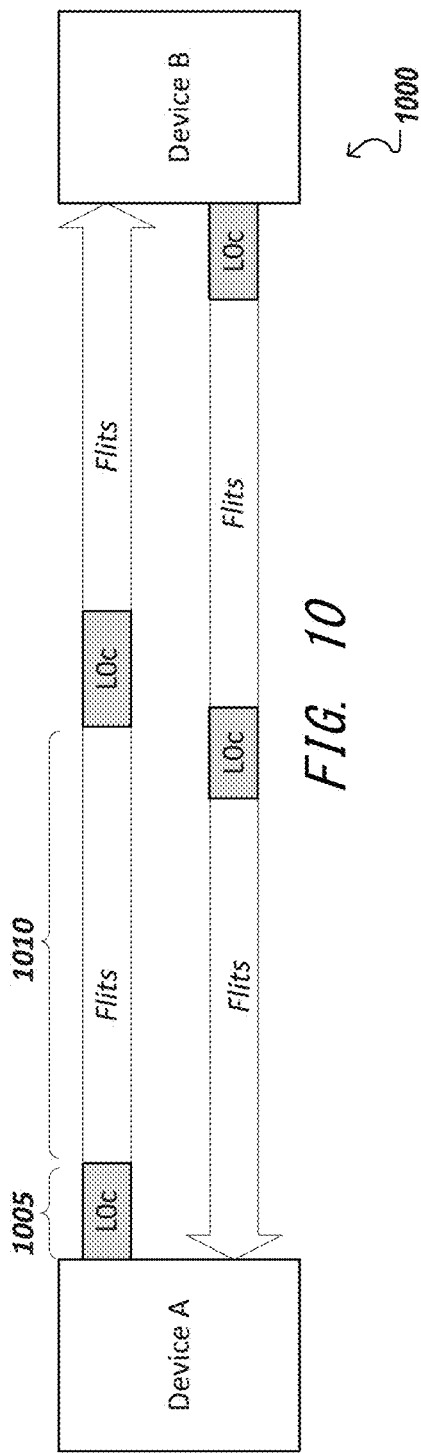
FIG. 10 illustrates an link layer data stream with embedded control windows.

In one example (e.g., as in FIG. 10), a link layer blocking control sequence (i.e. a blocking link state (BLS) or L0c state) can include a timed state during which the link layer flits are held off while the PHY information is communicated to the remote agent. Here, the transmitter and receiver may start a block control sequence timer. And upon expiration of the timers, the transmitter and receiver can exit the blocking state and may take other actions, such as exit to reset, exit to a different link state (or other state), including states that allow for the sending of flits across the link.

In one embodiment, link training can be provided and include the sending of one or more of scrambled training sequences, ordered sets, and control sequences, such as in connection with a defined supersequence. A training sequence symbol may include one or more of a header, reserved portions, a target latency, a pair number, a physical lane map code reference lanes or a group of lanes, and an initialization state. In one embodiment, the header can be sent with an acknowledgement (ACK) or negative acknowledgment (NAK), among other examples. As an example, training sequences may be sent as part of supersequences and may be scrambled.

In one embodiment, ordered sets and control sequences are not scrambled or staggered and are transmitted identically, simultaneously and completely on all lanes. A valid reception of an ordered set may include checking of at least a portion of the ordered set (or entire ordered set for partial ordered sets). Ordered sets may include an electrically ordered set (EOS), such as an Electrical Idle Ordered Set (EIOS) or an EIEOS. A supersequence may include a start of a data sequence (SDS) or a Fast Training Sequence (FTS). Such sets and control supersequences can be predefined and may have any pattern or hexadecimal representation, as well as any length. For example, ordered sets and supersequences may be a length of 8 bytes, 16, bytes, or 32 bytes, etc. FTS, as an example, can additionally be utilized for fast bit lock during exit of a partial width transmitting link state. Note that the FTS definition may be per lane and may utilize a rotated version of the FTS.

Supersequences, in one embodiment, can include the insertion of an EOS, such as an EIEOS, in a training sequence stream. When signaling starts, lanes, in one implementation, power-on in a staggered manner. This may result, however, in initial supersequences being seen truncated at the receiver on some lanes. Supersequences can be repeated however over short intervals (e.g., approximately one-thousand unit intervals (or ~1 KUI)). The training supersequences may additionally be used for one or more of deskew, configuration and for communicating initialization target, lane map, etc. The EIEOS can be used for one or more of transitioning a lane from inactive to active state, screening for good lanes, identifying symbol and TS boundaries, among other examples.

Turning to FIG. 9, representations of example supersequences are shown. For instance, an exemplary Detect supersequence 905 can be defined. The Detect supersequence 805 can include a repeating sequence of a single EIEOS (or other EOS) followed by a predefined number of instances of a particular training sequence (TS). In one example, the EIEOS can be transmitted, immediately followed by seven repeated instances of TS. When the last of the seven TSes is sent the EIEOS can be sent again followed by seven additional instances of TS, and so on. This sequence can be repeated according to a particular predefined frequency. In the example of FIG. 9, the EIEOS can reappear on the lanes approximately once every one thousand UIs (~1 KUI) followed by the remainder of the Detect supersequence 905. A receiver can monitor lanes for the presence of a repeating Detect supersequence 905 and upon validating the supersequence 905 can conclude that a remote agent is present, has been added (e.g., hot plugged) on the lanes, has awoke, or is reinitializing, etc.

In another example, another supersequence 910 can be defined to indicate a polling, configuration, or loopback condition or state. As with the example Detect supersequence 905, lanes of a link can be monitored by a receiver for such a Poll/Config/Loop supersequence 910 to identify a polling state, configuration state, or loopback state or condition. In one example, a Poll/Config/Loop supersequence 910 can begin with an EIEOS followed by a predefined number of repeated instances of a TS. For instance, in one example the EIEOS can be followed by thirty-one (31) instances of TS with the EIEOS repeating approximately every four thousand UI (e.g., ~4 KUI), among other examples.

Supersequences, such as Detect supersequence 905 and Poll/Config/Loop supersequence 910, etc., can potentially be sent substantially throughout the initialization or re-initialization of a link. A receiver, upon receiving and detecting a particular supersequence can, in some instances, respond by echoing the same supersequence to the transmitter over the lanes. The receiving and validation of a particular supersequence by transmitter and receiver can serve as a handshake to acknowledge a state or condition communicated through the supersequence. For instance, such a handshake (e.g., utilizing a Detect supersequence 905) can be used to identify reinitialization of a link. In another example, such a handshake can be utilized to indicate the end of an electrical reset or low power state, resulting in corresponding lanes being brought back up, among other examples. The end of the electrical reset can be identified, for instance, from a handshake between transmitter and receiver each transmitting a Detect supersequence 905.

In another example, lanes can be monitored for supersequences and use the supersequences in connection with the screening of lanes for detect, wake, state exits and entries, among other events. The predefined and predictable nature and form of supersequences can be further used to perform such initialization tasks as bit lock, byte lock, debouncing, descrambling, deskewing, adaptation, latency fixing, negotiated delays, and other potential uses. Indeed, lanes can be substantially continuously monitored for such events to quicken the ability of the system to react to and process such conditions. In some cases, supersequences can be sent within control windows (e.g., L0c control windows) to trigger link state transitions, among other examples.

Training sequences (TSes), in some instances, can include a header and various other fields (e.g., payload) that can be used to communicate information in connection with initialization of a link. For instance, in one example, fields for target latency, state, lane pair number, lane mapping, among other fields can be included. In some implementations, portions of a TS can be scrambled, for instance, by a random or pseudo-random binary sequence (PRBS). In one examples, the TS header can be preserved as cleartext while the remainder (or payload) of the TS is scrambled, for instance, by XORing those portions of the TS with a PRBS, among other examples.

In one implementation, a TS can be sixteen (16) bytes in length and the TS header can occupy the first byte (i.e., byte 0) of the TS. The TS payload can be scrambled and occupy the remaining fifteen bytes. In one example implementation, a TS tail or suffix can include the last few bytes of the TS. For instance, in one example, a scrambling synchronization field can occupy at least three bytes of the TS, for instance bytes 6-8 of the TS. The tail bits of the TS (e.g., bytes 9-15), in this particular implementation, can be maintained as reserved bits. Bits in bytes 6-15 can all be set to 0.

In some implementations, UPI can supports use of a TS header can be utilized instead of or in addition to a TS payload for key initialization parameters. In some implementations, TS payload may be used to exchange initialization parameters like ACKs and lane numbers. DC levels for communicating lane polarity may also be used. However, in some implementations, UPI can implement DC-balanced codes in the TS header for key parameters. For instance, in instances where a TS header is unscrambled, available TS header codes can be defined so that the number of "1"s substantially equal the number "0"s appearing in the TS header fields. DC balance can be realized throughout the remainder of the TS (e.g., the TS payload) by scrambling bits of the TS payload by XORing the bits against a random or pseudorandom binary sequence.

In one example implementation, a PRBS sequence can be utilized with at least 23 bits (PRBS23). The PRBS can be generated according to a particular selected polynomial. In one example, the PRBS can be generated by a similar bit size, self-seeded storage element, such as a linear feedback shift register (LFSR). The LFSR can be a 23-bit Fibonacci LFSR capable of generating a PRBS sequence of over 8 Mb in length. The PRBS can repeat following the end of the sequence. In some implementations, the entirety of the PRBS23 sequence can be used in the scrambling of training sequences included in supersequences used, for instance, in initialization of the link in UPI.

While the full length of a PRBS sequence can be used, in some implementations, UPI can support allowing the use of varying lengths of the available PRBS sequence (e.g., the use of only a portion of the PRBS23 sequence). In some examples, a controller of a device can specify that only a portion of the full length of a PRBS sequence be utilized. This can be desirable, for instance, in testing applications where repeatability of bit sequences is desired, among potentially other applications. A software-based controller can specifying varying lengths of the PRBS to be applied. For instance, BIOS of a device can specify the PRBS length to be applied on the link. In some implementations, use of the full length of the PRBS sequence can be the default setting, for instance, so as to maximize the benefits of the lengthy PRBS sequence.

Lane traffic in a transmitting link state (TLS) and training sequences can be scrambled with a PRBS of a particular minimum length (e.g., 23 bits). The starting seed applied to a stream can be varied between the lanes to enhance the electrical benefits of the PRBS on the link. In one example implementations, the PRBS can be generated by a 23 bit Fibonacci LFSR implementing a 6-tap generator polynomial, such as, $(x^{23}+x^{21}+x^{16}+x^{8}+x^{5}+x^{2}+1)$ or $(x^{23}+x^{21}+x^{18}+x^{15}+x^{7}+x^{2}+1)$.

The starting (on scrambler/descrambler initialization) seed values for lane number modulo 8 may be any value, for instance, 8 hexadecimal values where each one is associated with 2 or 3 of the lanes in a link. Use of such seeds can result in rotating (or staggering) of the PRBS between the lanes. The number of LFSRs can be reduced by using the property that even lane PRBS can be derived from an XOR of PRBS of odd lanes. The EIEOS and header of the training sequences may not scrambled. The entry point of a supersequence on each lane can be initiated (e.g., where the transmitter starts driving) at a different point on each lane. This can enable the lanes to be turned on in a staggered manner in order to reduce noise in the power delivery system. Indeed, each lane can have its own instance of an LFSR. The staggering times can vary by the number of lanes being turned on and may be implementation dependent during initialization. These can be specified in the timing diagrams and timer profiles for partial transmitting width state exit. Further, fast training sequences (FTS) (also discussed below) can also be rotated by lane.

In some instances, scrambling can reduce power supply noise at transmitter and provide a richer frequency spectrum at receiver. The scrambler can be initialized by the first EIEOS transmitted. The descrambler can be synchronized to the scrambler, for instance, through self-seeding. For instance, the received 23 bit pattern can be embedded in a field of the TS as a seed. In one example, the 23 bit seed can be identified from the scrambling of the bits of the scrambling synchronization field. The receiver can utilize the seed value to identify the specific location of the PRBS used to scramble the received TS. For instance, a receiver can identify the seed and load the seed into its own LFSR to synchronize to the PRBS used by the transmitter. In some instances, a receiver may read multiple scrambling synchronization field or multiple TSes in a supersequence in order to seed its own LFSR. Upon detecting and synching to the PRBS of the transmitter however, a receiver can descramble the remainder of the TSes as well as all subsequent TS sent in supersequences during initialization of the link, among other examples.

Supersequences can be used to facilitate bit lock and synchronization on a lane. As discussed above, at least a portion of the supersequences can be scrambled. Returning to the discussion of FIG. 9, a detect supersequence can be used by a receiver to detect, or lock, the bit and byte edges of the received bit stream and identify which bytes are being sent in the supersequence. For instance, the EIEOS and TS header can be left unscrambled to assist the receiver in more quickly locking to the supersequence. Additionally, the supersequence can be defined to allow the EIEOS (and beginning of the supersequence) to repeat at a relatively short frequency (e.g., to more quickly allow the receiver another chance to detect the EIEOS in the event that the first EIEOS was not accurately detected). For instance, in one example, a supersequence can be defined to repeat every 1 KUI or shorter. Such supersequences can further allow more randomized transitions during initialization, as well as simplifying TS lock, latency fixing, and other actions.

Additionally, leaving the EIEOS and TS header unscrambled can allow byte lock to occur and permit the receiver to be able to identify the location of subsequent bytes and symbols (including scrambled TS symbols). For instance, the edge of the unscrambled TS header can be identified and thereby also the start of scrambling synchronization field. Upon detecting the PRBS seed in the scrambling synchronization field, the receiver will know the following PRBS pattern values and will also be able to predict the values of subsequent scrambling synchronization field values. Accordingly, the receiver, upon locking to the PRBS can further utilize the scrambling synchronization field values to facilitate other configuration tasks such as adaptation, deskew, and other tasks.

On multi-lane links, symbols can be sent simultaneously on all lanes by a transmitter, however, link-to-link skew can manifest with some symbols not arriving at the receiver at the same time. Sources of skew can include, for instance, chip differential drivers and receivers, printed wiring board impedance variations, lane wire length mismatches, among other examples. In one embodiment, UPI provides advanced logic to deskew lanes. As an example, the TS boundary after TS lock can be used to deskew the lanes. For instance, TS lock can be used to detect skew (e.g., that a TS is arriving on one lane later than another TS on another one of the link's lanes). An EIEOS can also be used to detect skew. In addition, using the predictability of a synched PRBS pattern, some implementations of UPI may deskew by comparing lane PRBS patterns in the LFSR during specific points in the payload.

In the case of adaptation, electrical characteristics of a lane can be adjusted between a transmitter and receiver based, for instance, on sample data transmitted between the transmitter and receiver. For instance, receiver adaptation can include the transmitter sending a data pattern to the receiver with logic at the receiver adjusting electrical characteristics at the receiver to adapt the lane for the link. Transmitter adaptation can involve the transmitter sending sample data to the receiver and the receiver sending feedback to the transmitter that can be used by the transmitter to make adjustments at the transmitter to adapt the lane. The receiver can continue to send feedback to the transmitter based on the adjustments made at the transmitter.

In one example, adaptation sample data can be embodied through scrambled TS data. As one example, a fixed UI pattern may be utilized to scramble with a bypass to an adaptation state. But by scrambling TS with PRBS23, receiver adaptation may be performed without the bypass. In addition, offset and other errors may be reduced during clock recovery and sampling. The randomness provided through the a long PRBS sequence (e.g., PRBS23) can prove an effective sample stream for adaptation. Further, in some implementations, a lane can be set to operate in slow mode to assist the logic in analyzing and adapting to sample data received on the lane. Upon approving the characteristics of the lane through adaptation, the adapted characteristics can be set and applied to the initialization of the link.

Once the link has been successfully calibrated and configured, initialization can end and transition to the transmitting link state (TLS) in which flits begin to be transmitted. In some implementations of UPI, transitions to TLS can be based on planetary alignment on the system. For instance, a planetary alignment signal can indicate an opportunity to transition to TLS. Rather than transitioning at an edge of a supersequence, EIEOS, or TLS, some implementations of UPI can utilize a start of data sequence (SDS) symbol sent in accordance with the planetary alignment to end initialization and transition to TLS. In one example, an SDS can be sent anywhere in an initialization bit stream. Accordingly, a receiver can continuously scan received bits for the SDS to hasten ending of the initialization in accordance with a planetary alignment.

In one example, an example EIEOS can emulate a low frequency clock signal, such as a repeating FF00 signal. An example SDS can include a repeating F0 signal in some implementations. Accordingly, in such instances, detecting an SDS sent in the middle of an EIEOS can be relatively simple to identify, as the risk of aliasing within the EIEOS can be minimal. Scrambling of TS payloads, however, and the resulting randomness of the TS data can introduce the risk of aliasing of some forms of an SDS. In some implementations, a PRBS can be generated that will never alias an SDS or a portion of an EIEIOS over any particular span of a respective number of bits. Further, a tail or suffix can be provided on a TS, such as using the last bytes of the TS or zeroing-out the payload of the PRBS to cause the PRBS to be XOR 0 values in the suffix and effectively present the PRBS in cleartext at the end of the TS.

In some implementations, on exit from a Configuration state to TLS, the transmit and receive LFSRs can be re-initialized by the SDS exchanged between transmitter and receiver. For instance, in eight starting PRBS seeds can be applied to lanes 0 . . . 7, 12 . . . 19, and 8 . . . 11 (e.g., first four only) respectively. Further, lane reversal of a link and polarity inversion of a lane can also be determined, for instance, by comparing the unscrambled first byte of the TS (e.g., the TS header) after the EIEOS to a set of possible values, among other examples.

In the case of debouncing, transients can be introduced on lanes as a result of a variety of conditions. For instance, the addition or powering-on of a device can introduce transients onto the lane. Additionally, voltage irregularities can be presented on a lane because of poor lane quality or electrical failure. In some cases "bouncing" on a lane can produce false positives, such as a false EIEOS. However, in some implementations, while supersequences can be begin with an EIEOS, defined supersequences can further include additional sequences of data as well as a defined frequency at which the EIEOS will be repeated. As a result, even where a false EIEOS appears on a lane, a logic analyzer at the receiver can determine that the EIEOS is a false positive by validating data that succeeds the false EIEOS. For instance, if expected TS or other data does not follow the EIEOS or the EIEOS does not repeat within a particular one of the predefined frequencies of one of the predefined supersequences, the receiver logic analyzer can fail validation of the received EIEOS. As bouncing can occur at start up as a device is added to a line, false negatives can also result. For instance, upon being added to a set of lanes, a device can begin sending a Detect supersequence 905 to alert the other side of the link of its presence and begin initialization of the link. However, transients introduced on the lanes may corrupt the initial EIEOS, TS instances, and other data of the supersequence. However, a logic analyzer on the receiving device can continue to monitor the lanes and identify the next EIEOS sent by the new device in the repeating Detect supersequence 905, among other examples.

In one example, a transmitting device can attempt to enter a particular state. For instance, the transmitting device can attempt to activate the link and enter an initialization state. In another example, the transmitting device can attempt to exit a low power state, such as an L1 state, among other examples. In some instances of an L1 state, the L1 state can serve as a power savings, idle, or standby state. Indeed, in some examples, main power supplies may remain active in the L1 state. In exiting an L1 state, a first device can send a supersequence associated with transitioning from the L1 state to a particular other state, such as an L0 transmitting link state (TLS). The supersequence, as in other examples, can be a repeating sequence of an EOS followed by a predetermined number of TSes such that the EOS is repeated at a particular predefined frequency. In one examples, a Detect supersequence can be used to exit the L1 or other low power state. A receiving device can receive and validate the data, identifying the supersequence, and the receiving device can complete the handshake with the transmitting device by sending the supersequence back to the transmitting device.

With both the transmitting and receiving devices receiving the same supersequence, each device can further perform additional initialization tasks utilizing the supersequences. For instance, each device can perform debouncing, bit lock, byte lock, descrambling, and deskewing utilizing the supersequences. Additional initialization information can be communicated through the headers and payloads of the TSes included in the supersequences. When the link is initialized, a start data send (SDS) sequence can be sent, in some cases, interrupting the supersequence (e.g., sent in the middle of a TS or EIEOS) and the respective devices on either side of the link can prepare for the synchronized entry into TLS. In TLS, or an "L0" state, supersequences can be ended and flits can be transmitted utilizing the Link layer of the protocol stack.

While in TLS, the Physical layer may still be provided limited opportunities to perform control tasks. For instance, bit errors and other errors may be identified on one or more lanes during an L0 state. In one implementation, a control state L0c can be provided. The L0c state can be provided as a periodic window within the TLS to allow Physical layer control messages to be sent between streams of flits sent through the Link layer. For instance, as represented in the example illustrated in FIG. 10, an L0 state can be subdivided into L0c intervals. Each L0c interval can begin with a L0c state or window (e.g., 1005) in which Physical layer control codes and other data can be sent. The remainder (e.g., 1010) of the L0c interval can be dedicated to the sending of flits. The length of the L0c interval and L0c state in each interval can be programmatically defined, for instance by BIOS of one or more devices or another software-based controller, among other examples. The L0c state can be exponentially shorter than the remainder of an L0c interval. For instance, in one example, the L0c can be 8 UI while the remainder of the L0c interval is on the order of 4 KUI, among other examples. This can allow windows in which relatively short, predefined messages can be sent without substantially disrupting or wasting link data bandwidth.

L0c state message can communicate a variety of conditions at the Physical layer level. In one example, one device can initiate a reset of the link or a lane, for instance, based on bit errors or other errors in excess of a particular threshold amount. Such errors can also be communicated in L0c windows (such as preceding L0c windows). The L0c state can also be leveraged to realize other in-band signaling, such as signaling for use in aiding or triggering transitions between other link states. In one example, L0c messages can be utilized to transition a link from an active L0 state to a standby or low power state, such as an L1 state. For instance, a particular L0c state can be used to communicate a L1 entry request, a reset request, or other request. The request can involve the sending of a corresponding supersequence defined to indicate an entry or exit from a link state, among other examples.

In addition (or as an alternate) to handshaking using L0c codes, supersequences, such as Detect supersequence, can be sent in connection with resetting and re-initializing the link. Further handshaking can occur between the devices as the supersequences sent by a first device and echoed by the second, receiving device. Supersequences can be used, as described above, to assist in the reinitialization of the link including debouncing, bit lock, byte lock, descrambling, and deskewing the lanes of the link. Further, the devices can utilize the timer (e.g., embodying the L0c interval) to synchronize entry of the devices and the link into the requested state, among other examples.

In one embodiment, a platform can include a clock that serves as the reference clock for devices in the system. The clock can be embedded in the data so there are no separate clock lanes. The clock signal can be extracted from received data. Further, the flits sent over the lanes can be scrambled to facilitate clock recovery. The receiver clock recovery unit, as one example, can deliver sampling clocks to a receiver (i.e. the receiver recovers clock from the data and uses it to sample the incoming data). Receivers in some implementations continuously adapt to an incoming bit stream. By embedding the clock, pinout can be potentially reduced. However, embedding the clock in the in-band data can alter the manner in which in-band reset is approached. In one embodiment, a blocking link state (BLS) can be utilized after initialization. Also, electrical ordered set supersequences may be utilized during initialization to facilitate the reset (e.g., as described above), among other considerations. The embedded clock can be common between the devices on a link and the common operational clock can be set during calibration and configuration of the link.

In some implementations of UPI, adaptation of lanes on a link can be supported. The Physical layer can support both receiver adaptation and transmitter, or sender, adaptation. With receiver adaptation, the transmitter on a lane can send sample data to the receiver which the receiver logic can process to identify shortcomings in the electrical characteristics of the lane and quality of the signal. The receiver can then make adjustments to the calibration of the lane to optimize the lane based on the analysis of the received sample data. In the case of transmitter adaptation, the receiver can again receive sample data and develop metrics describing the quality of the lane but in this case communicate the metrics to the transmitter (e.g., using a backchannel, such as a software, hardware, embedded, sideband or other channel) to allow the transmitter to make adjustments to the lane based on the feedback. Receiver adaptation can be initiated at the start of the Polling state using the Polling supersequence sent from the remote transmitter. Similarly, transmitter adaptation can be done by repeating the following for each transmitter parameters. Both agents can enter Loopback Pattern state as masters and transmit specified pattern. Both receivers can measure the metric (e.g. BER) for that particular transmitter setting at a remote agent. Both agents can go to Loopback Marker state and then Reset and use backchannels (slow mode TLS or sideband) to exchange metrics. Based on these metrics, the next transmitter setting can be identified. Eventually the optimal transmitter setting can be identified and saved for subsequent use.

In adaptation, a transmitter of an agent can transmit to a remote receiver a random, or pseudo random pattern. In some instances, scrambled supersequences can be used as the pattern. Logic at the receiver can determine characteristics of one or more lanes of the link and generate metric data describing such characteristics. In the case of receiver adaptation, the receiver can attempt to determine optimal configurations for a lane based on the metrics and apply these configurations at the receiver. In the case of transmitter adaptation, the receiver can communicate metrics to the transmitter for use by the transmitter agent to configure and adapt the lane based on the metric. In either instance, in some implementations, hardware or software can be utilized to assess different transmitter settings in algorithmic order to determine the optimal settings.

Receiver adaptation can be initiated at the start of the Polling state using the Polling supersequence sent from the remote transmitter. Similarly, transmitter adaptation can be done by repeating the following for each transmitter parameters. Both agents can enter Loopback Pattern state as masters and transmit specified pattern. Further, both receivers can measure the metric (e.g. BER) for that particular transmitter setting at a remote agent. Both agents can go to Loopback Marker state and then Reset and use backchannels (slow mode TLS or sideband) to exchange metrics. Based on these metrics, the next transmitter setting can be identified. Eventually the optimal transmitter setting can be identified and saved for subsequent use.

Some systems and devices utilizing UPI can be deterministic such that their transactions and interactions with other systems, including communications over an UPI link, are synchronized with particular events on the system or device. Such synchronization can take place according to a planetary alignment point or signal corresponding to the deterministic events. For instance, a planetary alignment signal can be used to synchronize state transitions, including entry into a link transmitting state, with other events on the device. In some instances, sync counters can be employed to maintain alignment with a planetary alignment of a device. For instance, each agent can include a local sync counter which is initialized by a planetary aligned signal (i.e., common and simultaneous (except for fixed skew) to all agents/layers which are in sync). This sync counter can count alignment points correctly even in powered down or low-power states (e.g., L1 state) and can be used to time the initialization process (after reset or L1 exit), including the boundaries (i.e., beginning or end) of an EIEOS (or other EOS) included in a supersequence utilized during initialization. Such supersequences can be fixed in size and greater than max possible latency on a link. EIEOS-TS boundaries in a supersequence can thus be used as a proxy for a remote sync counter value.

Further, UPI can support master-slave models where a deterministic master device or system can drive timing of interaction with another device according to its own planetary alignment moments. Further, in some examples, master-master determinism can be supported. Master-master or master slave determinism can ensures that two or more link-pairs can be in lock-step at the Link layer and above. In master-master determinism, each direction's exit from initialization can be controlled by respective transmitter. In the case of master-slave determinism, a master agent can controls the determinism of the link pair (i.e., in both directions) by making a slave transmitter initialization exit wait for its receiver to exit initialization, for instance, among other potential examples and implementations.

In some implementations, a synchronization (or "sync") counter can be utilized in connection with maintaining determinism within an UPI environment. For instance, a sync counter may be implemented to count a defined amount, such as 256 or 512 UI. This sync counter may be reset by an asynchronous event and may count continuously (with rollover) from then (potentially even during a low power link state). Pin-based resets (e.g., power on reset, warm reset) may be synchronizing events that reset a sync counter, among other example. In one embodiment, these events can occur at two sides with skew less (and, in many cases, much less) than the sync counter value. During initialization, the start of the transmitted exit ordered set (e.g., EIEOS) preceding a training sequence of a training supersequence may be aligned with the reset value of the sync counter (e.g., sync counter rollover). Such sync counters can be maintained at each agent on a link so as to preserve determinism through maintaining constant latency of flit transmissions over a particular link.

Control sequences and codes, among other signals, can be synchronized with a planetary alignment signal. For instance, EIEOS sequences, BLS or L0c windows (and included codes), SDSes, etc. can be configured to be synchronized to a planetary alignment. Further, synchronization counters can be reset according to an external signal, such as a planetary alignment signal from a device so as to itself be synchronized with the planetary alignment, among other examples.

Sync counters of both agents on a link can be synchronized. Resetting, initializing, or re-initialization of a link can include a reset of the sync counters to realign the sync counters with each other and/or an external control signal (e.g., a planetary alignment signal). In some implementations, sync counters may only be reset through an entry into a reset state. In some instances, determinism can be maintained, such as in a return to an L0 state, without a reset of the sync counter. Instead, other signals already tuned to a planetary alignment, or other deterministic event can be used as a proxy for a reset. In some implementations, an EIEOS can be used in a deterministic state entry. In some instances, the boundary of the EIEOS and an initial TS of a supersequence can be used to identify a synchronization moment and synchronize sync counters of one of the agents on a link. The end of an EIEOS can be used, for instance, to avoid the potential of transients corrupting the start boundary of the EIEOS, among other examples.

Latency fixing can also be provided in some implementations of UPI. Latency can include not only the latency introduced by the transmission line used for communication of flits, but also the latency resulting from processing by the agent on the other side the link. Latency of a lane can be determined during initialization of the link. Further, changes in the latency can also be determined. From the determined latency, latency fixing can be initiated to compensate for such changes and return the latency expected for the lane to a constant, expected value. Maintaining consistent latency on a lane can be critical to maintaining determinism in some systems.

Latency can be fixed at a receiver link layer to a programmed value in some implementations using a latency buffer in conjunction with determinism and enabled by starting a detect (e.g., by sending a Detect supersequence) on a sync counter rollover. Accordingly, in one example, a transmitted EIEOS (or other EOS) in Polling and configuration can occur on a sync counter rollover. In other words, the EIEOS can be precisely aligned with the sync counter, such that a synchronized EIEOS (or other EOS) can serve as a proxy, in some instances, for the sync counter value itself, at least in connection with certain latency fixing activities. For instance, a receiver can add enough latency to a received EIEOS so that it meets the dictated target latency at the Physical layer-Link layer interface. As an example, if the target latency is 96 UI and the receiver EIEOS after deskew is at sync count 80 UI, 16 UI of latency can be added. In essence, given the synchronization of an EIEOS, latency of a lane can be determined based on the delay between when the EIEOS was known to be sent (e.g., at a particular sync counter value) and when the EIEOS was received. Further, latency can be fixed utilizing the EIEOS (e.g., by adding latency to the transmission of an EIEOS to maintain a target latency, etc.).

Latency fixing can be used within the context of determinism to permit an external entity (such as an entity providing a planetary alignment signal) to synchronize the physical state of two agents across the link in two directions. Such a feature can be used, for example, in debugging problems in the field and for supporting lock-step behavior. Accordingly, such implementations can include external control of one or more signals that may cause the Physical layer to transition to a transmitting link state (TLS) on two agents. Agents possessing determinism capabilities can exit initialization on a TS boundary, which is also potentially the clean flit boundary when or after the signal is asserted. Master-slave determinism may allow a master to synchronize the Physical layer state of master and slave agents across the link in both directions. If enabled, the slave transmitter exit from initialization can depend on (e.g., follow or be coordinated with) its receiver exit from initialization (in addition to other considerations based on determinism). Agents which have Determinism capability may additionally possess functionality for entering a BLS or L0c window on a clean flit, among other examples.

In some implementations, determinism in UPI can include facilitating the ability of one agent to determine and apply a delay based on a deterministic signal. A master can send an indication of a target latency to a remote agent. The remote agent can determine actual latency on a lane and apply a delay to adjust the latency to meet the target latency (e.g., identified in a TS). Adjusting the delay or latency can assist in facilitating the eventual synchronized entry into a link transmitting state at a planetary alignment point. A delay value can be communicated by a master to a slave, for instance, in a TS payload of a supersequence. The delay can specify a particular number UIs determined for the delay. The slave can delay entry into a state based on the determined delay. Such delays can be used, for instance, to facilitate testing, to stagger L0c intervals on lanes of a link, among other examples.

As noted above, a state exit can be take place according to a planetary alignment point. For instance, an SDS can be sent to interrupt a state supersequence can to drive transition from the state to another state. The sending of the SDS can be timed to coincide with a planetary alignment point and, in some cases, in response to a planetary alignment signal. In other instances, the sending of an SDS can be synchronized with a planetary alignment point based on a sync counter value or other signal synchronized to the planetary alignment. An SDS can be sent at any point in a supersequence, in some cases, interrupting a particular TS or EIEOS, etc. of the supersequence. This can ensure that the state transitions with little delay while retaining alignment with a planetary alignment point, among other examples.

In some implementations, high speed links, such as those supporting and utilizing UPI, can be constrained in length due to the electrical demands on the physical wires implementing the links. Link extending devices can be utilized, in some implementations, to effectively "splice" together link sections to form a link with a length in excess of traditional constraints. For instance, electrical driver/receivers in an implementation of an UPI system can be optimized to electrical channels of limited length and bandwidth (e.g. 24" of FR4 at 10.4 Gbs). This can be more than acceptable for geometrically smaller architectures, but for systems employing larger form factors, such as server racks and other more sizable high speed systems, extension, or repeater, devices, such as retimers or redrivers, may be employed to extend the length of the link. Further, optical links can be introduced to replace or supplement a section of the electrical link and thereby increase the distances of physical links supporting UPI.

As noted above, in some implementations of an UPI, one or more link states and link state machine transitions can be defined that rely on the detection of pulldowns to determine the presence of a remote receiver on a link. For instance, as shown in the example state machine of FIG. 7, the link coupling two devices may be active in all but three states, Event Reset, Calibration Reset, and Receiver Detect. In one or more of these idle states, a receiver termination can be used to detect the presence of the receiver on the other end of the link and thereby prompt exit or transition from the link state. For instance, a RxDetect state can involve a transmitting device monitoring a link for a receiver termination on the other end of the link. This can cause the state to transition to a state where data is actively signaled from the transmitter to the receiver. In some implementations, connecting a device to the other end of a link to which another device is already connected can cause a pulldown voltage to manifest on the link. The existing device can detect the pulldown voltage and interpret the pulldown as a signal indicating the presence of a companion device on the link.

Figure 11:
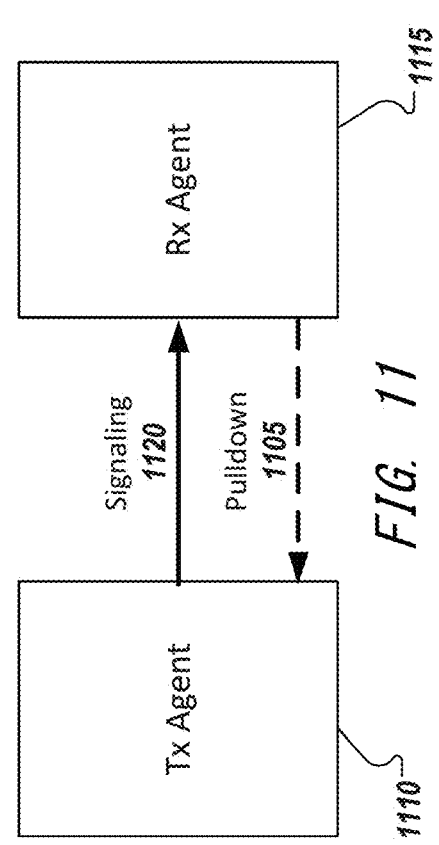
FIG. 11 illustrates a simplified block diagram representing pulldowns on an electrical link.

FIG. 11 is simplified block diagram 1100 illustrating the concept of one device (e.g., 1110) detecting the presence of another device (e.g., 1115) on a link. Specifically, in this example, a pulldown voltage 1105 can be manifest on lanes of a particular link connecting a transmitter 1110 to a receiver 1115 (in the reverse direction of the lanes) in response to the receiver inserting (or having previously inserted) its terminations and electrically connecting to the link. For instance, at power-up, presence of a receiver can cause a pulldown voltage 1105 to be generated. The transmitter 1110 can include detection logic for determining that the characteristics of the pulldown voltage 1105 correspond to what would be expected to be generated by a receiver 1115 terminated at the other end of the link. Detection of the companion device can allow further link initialization steps to make forward progress. In instances where no companion receiver device (e.g., 1115) is detected as present on the link, the transmitting device can go into a low power, idle, or power-off state.

The same lanes on which a pulldown voltage 1105 is manifest can also be used by the transmitter 1110, following detection steps of the link initialization, to send signals 1120 to the receiver 1115. Such signals can include OSes, TSes, and other patterns sent in connection with further configuration, adaptation, and training of the link. Further, following link initialization and training, data can be sent in active link state signals from the transmitter to the receiver over these link lanes.

Figure 12:
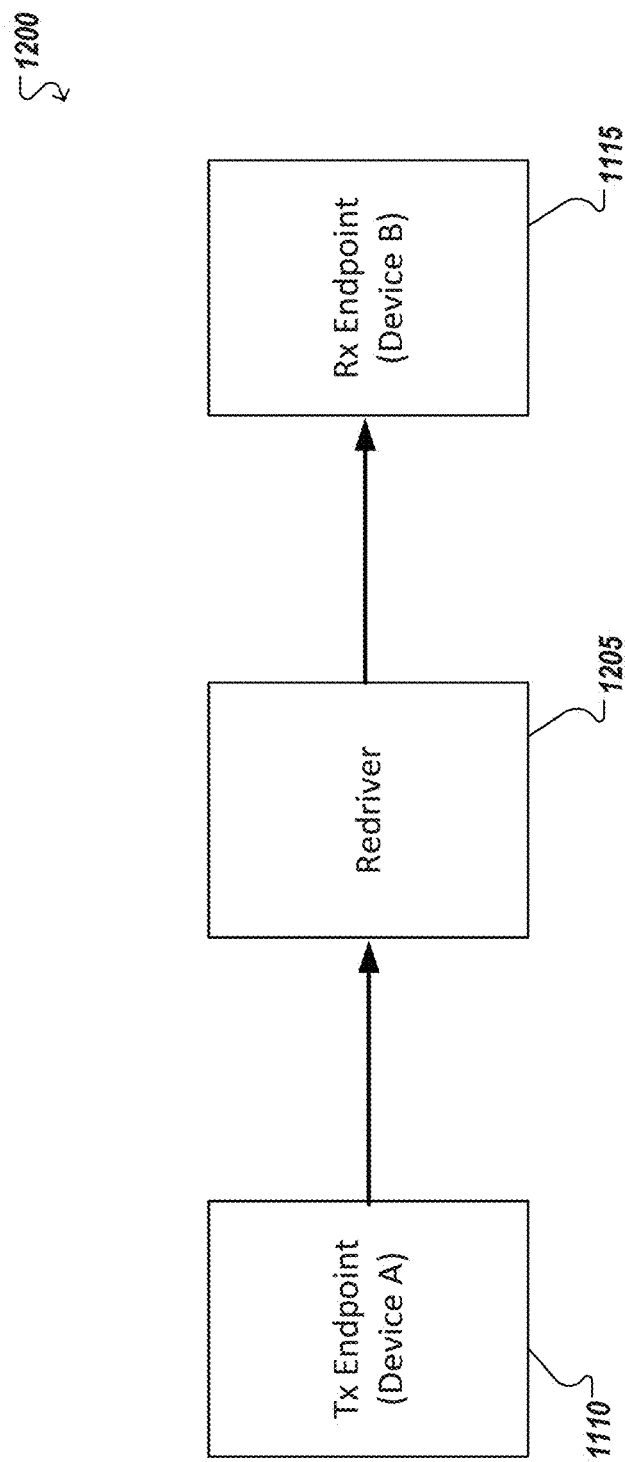
FIG. 12 illustrates a simplified block diagram representing a link utilizing a redriver.

As noted above, in some instances, the high speed frequencies utilized by interconnect technologies (such as UPI) can limit (either formally or practically) the physical length of corresponding links connecting two devices. Repeater devices, such as redrivers and retimers are becoming more widely used in various applications, such as in larger system form factors, such as server platforms, to extend the physical lengths of high-speed data links on various interconnect I/O's, including such examples as USB, SATA, SAS, PCIe, etc. FIG. 12 shows a simplified block diagram 1200 showing a redriver device 1205 provided to implement a link connecting a transmitter 1110 and a receiver 1115. In this example, the receive side of the redriver 1205 is connected to the transmitter of device 1110 and the transmit side of the redriver 1205 is connected to the receiver of device 1115. Redrivers (e.g., 1205) are typically analog devices that reshape (e.g., amplify) the input signals it receives (e.g., from a transmitting (Tx) device) before re-driving the signal out to the intended receiver (Rx). Redrivers can amplify the signals it receives, sending the amplified (or redriven) signal further down the next leg of the link, toward the receiving device (e.g., 1115). Such signal amplifying, or driving, can compensate for any extra loss in the long channel that may otherwise exceed the capability of the drivers and receivers of the Tx and Rx endpoints. Further, the demand for such extender devices is likely to continue to increase as the increases of I/O bandwidth outpaces the improvement of interconnects, due to platform cost constraints and other factors.

Continuing with the example of FIG. 12, in order to support link state transitions and link configuration activities that make use of the detection of a defined receiver pulldown voltage, a transmitting device, Device A 1110 can include pulldown detection logic configured to identify voltages on the link that correspond to an expected pulldown voltage from a receiving device present on the link. Such pulldown voltages can serve, for example, as step in a handshake to exit a detect state (e.g., RxDetect) and make forward progress toward an active link state. However, the inclusion of a redriver (e.g., 1205) can interfere and undermine the ability of a pulldown voltage from Device B 1115 to be detected by companion device, Device A 1110. For instance, while the insertion of the terminations of Device B 1115 will generate a pulldown voltage with characteristics that comply with the pulldown voltage expected by Device A during detect state monitoring, the pulldown voltage will ordinarily only manifest at the transmit side of the redriver 1205 and will not be visible at the Tx endpoint 1110. Accordingly, no handshake can be completed as the pulldown voltage is not delivered to the Tx endpoint and the Tx endpoint 1110 is unaware that a partner device is present, given that the pulldown voltage is effectively "intercepted" by conventional redrivers. Accordingly, an improved redriver device can be provided, as set forth in further detail herein, which can allow pulldown voltages of an Rx endpoint to be detected at the improved redriver and relayed to the Tx at the receive side of the redriver 1205, to allow detection of the Rx endpoint 1115 at the Tx endpoint 1110 to be realized.

Figure 13:
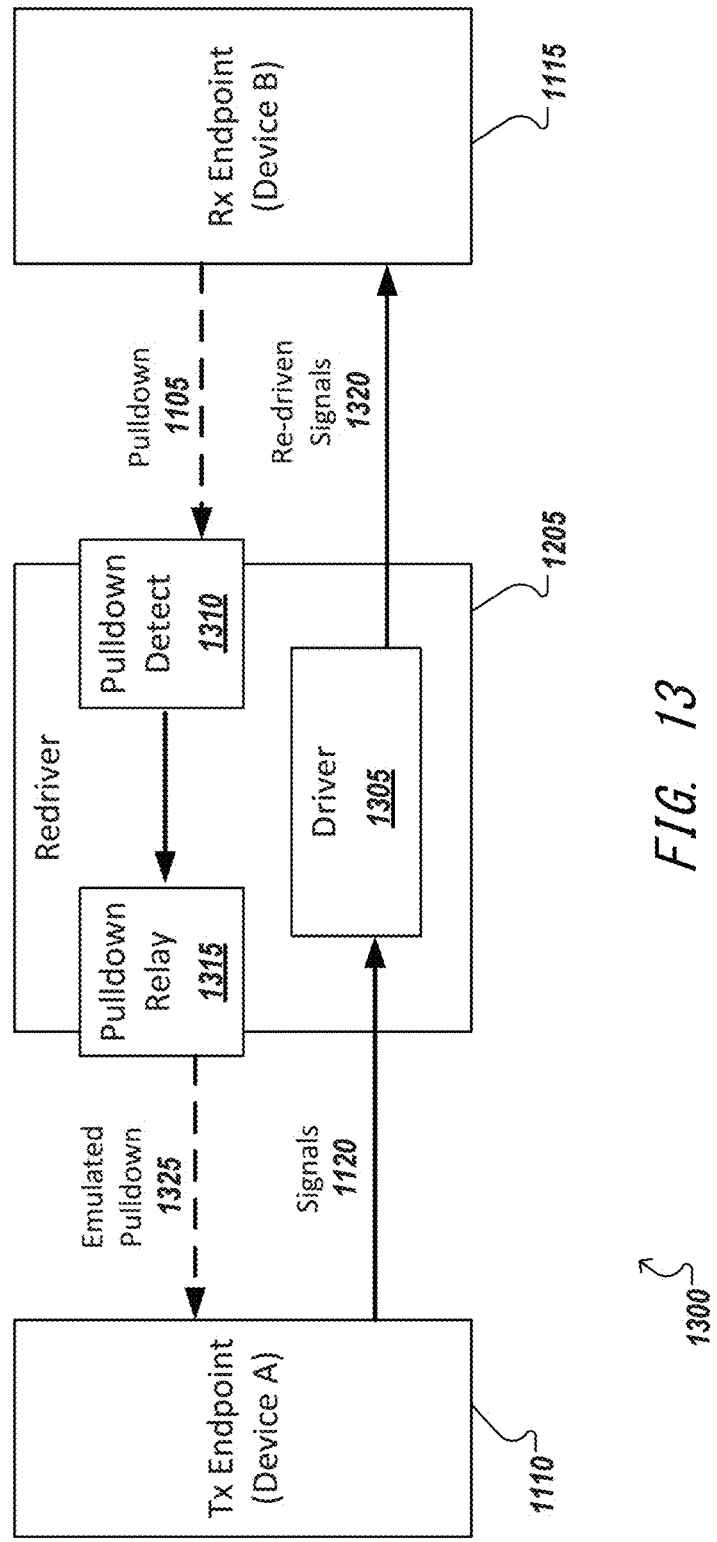
FIG. 13 illustrates a simplified block diagram representing use of an example redriver in a link.

Turning to the simplified block diagram 1300 of the example of FIG. 13, a representation of an enhanced redriver 1205 is illustrated. In this example, the redriver 1205, in addition to its core signal driving circuitry 1305, can include (or be connected to) additional circuitry used to relay pulldown voltages (e.g., 1105) manifesting at the redriver's 1205 transmit pins (e.g., due to the presence of device 1115) to a transmit device 1110. For example, a redriver 1205 can be provided with pulldown detection circuitry 1310 and pulldown relay circuitry 1315. In one implementation, pulldown detection circuitry 1310 can be configured to recognize pulldown voltages that correspond to a define envelope (e.g., amplitude and duration) as would be expected for pulldown voltages generated by a receiver device (e.g., 1115) on the link. Detection of a compliant pulldown voltage can cause the pulldown detection logic 1310 to signal or otherwise trigger pulldown relay logic 1315 to cause an emulated pulldown voltage 1325 to be generated (using the pulldown relay circuitry 1315) that exhibits characteristics recognizable by the Tx endpoint 1110 (or detection circuitry of the Tx endpoint) as a pulldown voltage exhibited by a companion device (e.g., 1115) on the link. During this pulldown detect phase, the presence of the redriver on the link and its involvement in providing the pulldown voltage (e.g., 1325) to the transmitter, can effectively be invisible to the endpoints 1110, 1115.

Continuing with the example of FIG. 13, in some implementations, during active signaling on the link (e.g., the sending of signals 1120 from the Tx endpoint 1110 to the Rx endpoint 1115 over the link), the pulldown support logic (e.g., 1310, 1315) of the redriver 1205 can be disabled or end-run. Accordingly, when in active mode, the redriver 1205 can default into its conventional mode of operation to redrive received signals (e.g., 1120) using driver logic 1305 onto the lanes connecting the redriver 1205 to the Rx endpoint 1320. As noted above, the same lanes used to detect a pulldown 1105 and generate an emulated version 1325 of the same are used for the transmission and redriving of signals 1120, 1125 during active link states.

In some cases, an interconnect may provide endpoints that operate using a DC-coupled electrical layer. For instance, UPI and UPI endpoints can be implemented according to a DC-coupled design. This notwithstanding, in some implementations, a redriver employing AC-coupling may be used on a link connecting DC-coupled endpoints. In some cases, it can be generally desirable to use AC-coupled redrivers. Indeed, recent advancements in redrivers have largely centered around AC-coupled designs, and AC-coupled redrivers can be more readily available and trusted than DC-coupled alternatives, among other considerations. In one example, ng to termination of a second endpoint device on the link;d as a redriver between UPI endpoint endpoint devices employing DC coupling. However, utilizing an AC-coupled redriver can further complicate the relaying of pulldown voltages manifesting on a DC-coupled interconnect (e.g., for use in link presence detection). For instance, at the link detection stage, a transmitting device (Tx) can be weakly pulled up, to detect if there is a low impedance termination presence at the receiver (Rx) side of the link. Such receiver detection can be performed in an initial boot-up or after a link reset. Such link presence detection schemes can be disrupted when an active device, such as a re-driver, is added to the link, as the channel (and the use of the redriver) connecting the Tx endpoint to the Rx endpoint may not be transparent. In such instances, the Rx status (i.e., whether it is present or not) would be unknown to the Tx.

Figure 14:
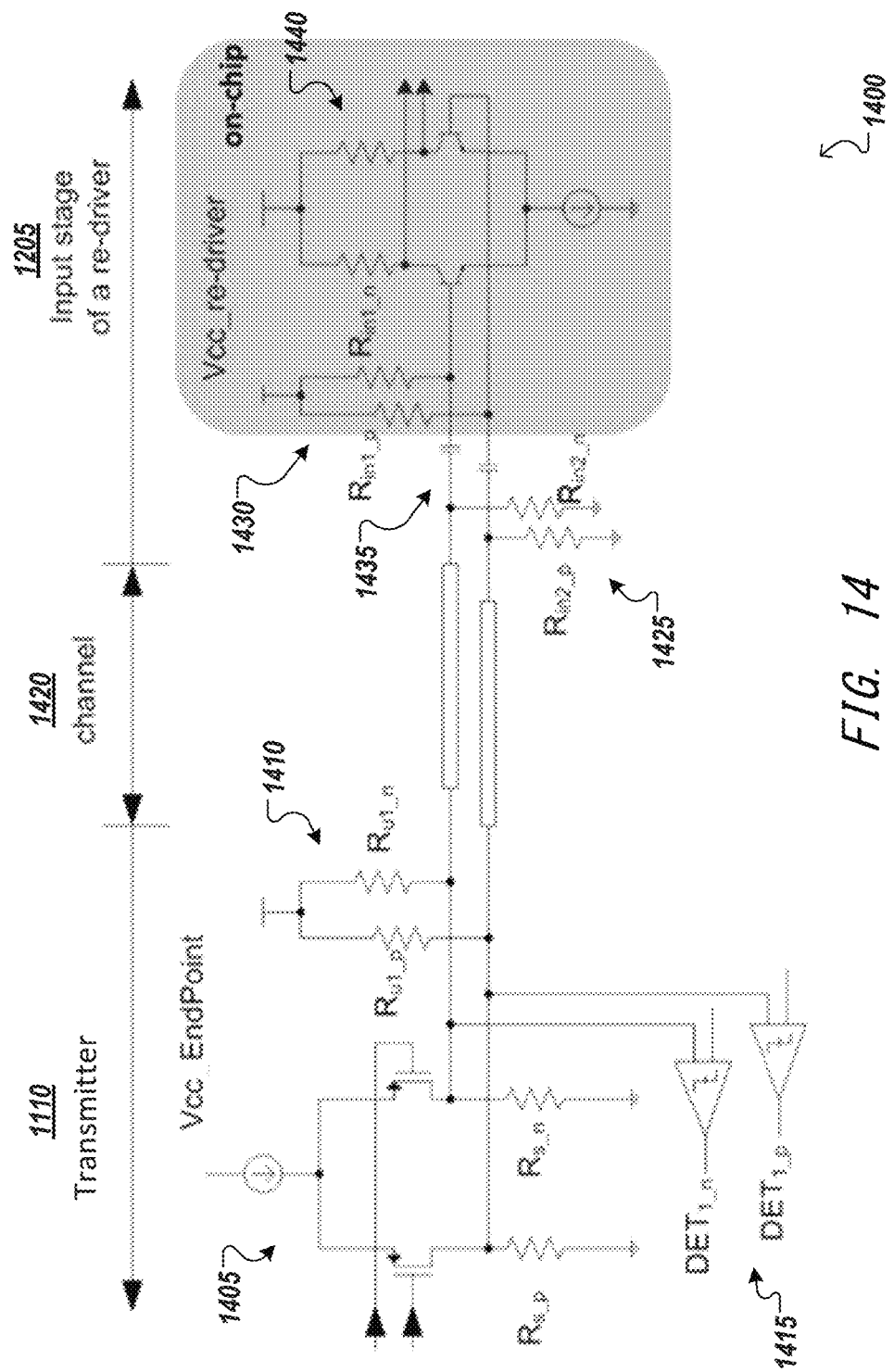
FIG. 14 illustrates a simplified circuit diagram representing a first implementation of an input stage of a redriver connected to an endpoint.

FIG. 14 illustrates a circuit diagram 1400 showing a connection between transmitter logic 1405 of an endpoint device 1110 and a receiver, or input stage, of an AC-coupled redriver 1205. Further, FIG. 14 illustrates the detection circuitry (e.g., 1410, 1415) of the transmitter endpoint 1110 for use in detecting a receiver pulldown voltage on the channel 1420. For instance, on the endpoint Tx 1110, $R_{u1\_p}$ and $R_{ui\_n}$ (1410) are the pull-up resistors for the link detection on the endpoint. In this case, the AC-coupled redriver 1205 is assumed to be designed for AC coupled links. In FIG. 14, a portion of example pulldown relay logic is shown supplementing a convention AC-coupled redriver design. To facilitate the generation of a pulldown voltage at the receiver pins of the redriver 1205, resistors $R_{in2\_p}$ and $R_{in2\_n}$ (1425) are added to an AC-coupled redriver design to enable pulldown voltages to be created at the redriver and allow UPI link detect by the Tx endpoint. In this example, resistors $R_{in2\_p}$ and $R_{in1\_n}$ are provided on the board and not on the redriver chip itself. Further resistors $R_{in1\_p}$ and $R_{in1\_n}$ (1430) can be provided at the redriver receiver (on the other side of the AC coupling capacitors 1435) on-chip with the main driver circuitry (e.g., 1440) of the redriver 1205. The pulldown resistors $R_{in2\_p}$ and $R_{in2\_n}$ (1425) can be positioned before the AC coupling capacitors (1435) (as the capacitors 1435 manifest as open circuits during a receiver detect phase). The advantage of this particular implementation (shown in FIG. 14) is that it has minimum impact to traditional AC-coupled redriver design and allows legacy AC-coupled redrivers to be utilized with the additional circuitry (e.g., $R_{in2\_p}$ and $R_{in2\_n}$). In other words, pulldown resistors $R_{in2\_p}$ and $R_{in2\_n}$ (1425) can be added to supplement functionality of a more conventional redriver design. On the other hand, because the additional components for the redriver (e.g., off-chip resistors $R_{in2\_p}$ and $R_{in2\_n}$ (1425)) are either on boards or in package, this example has the potential to introduce additional discontinuities in the channels, add board area, and bill of materials cost, among other example issues.

Figure 15:
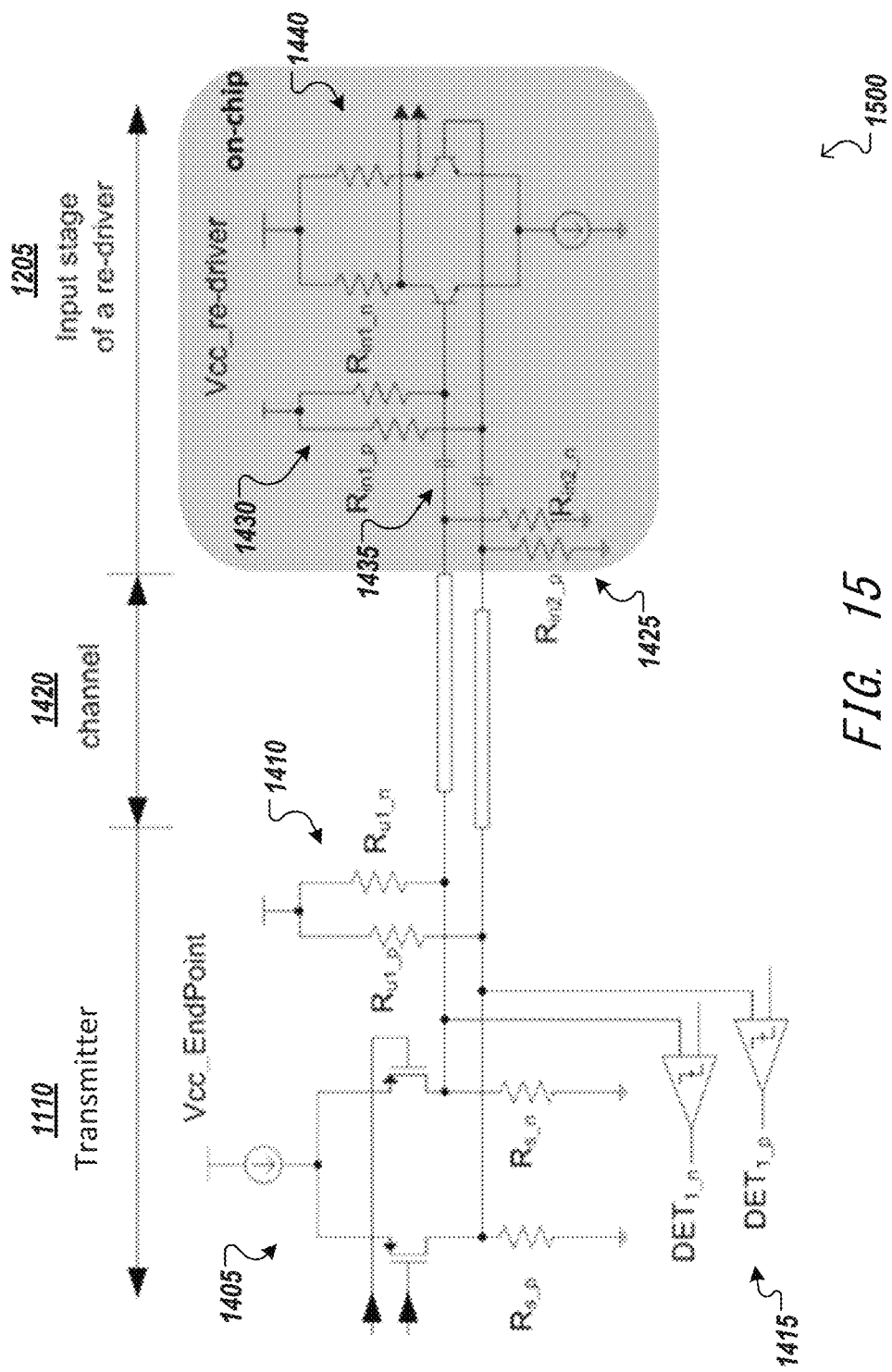
FIG. 15 illustrates a simplified circuit diagram representing a second implementation of an input stage of a redriver connected to an endpoint.

FIG. 15 is a circuit diagram 1500 illustrating an alternative implementation of the enhancements shown in FIG. 14 to receive-side circuity of an example AC-coupled redriver. In the example of FIG. 15, rather than providing pulldown resisters $R_{in2\_p}$ and $R_{in2\_n}$ off the redriver chip, the pulldown resistors 1425 are provided on-chip as an enhanced redriver device package. Consequently, the AC coupling capacitors 1430 (i.e., DC-blocking capacitors) are also integrated into the redriver chip. Such a re-driver design can make the board layout simpler and more compact (e.g., by foregoing extra on-board components). However, the on-chip capacitors may not be able to be configured with large enough capacitance in some applications. Accordingly, in some instances, additional circuity may be provided with the on-chip design shown in FIG. 15, for instance, to address DC wandering correlation and other factors.

The values of pulldown resistors $R_{in2\_p}$ and $R_{in2\_n}$ (1425) added to the input (or Rx) phase of the redriver 1205 may be configured to not only provide the pulldown voltage corresponding to a defined receiver detect state, but may also be configured for impedance line matching. The resistors $R_{in1\_p}$ and and $R_{in2\_p}$, and $R_{in1\_n}$ and Rin2_n represent the pulldown and pull-up resister of the two legs of a differential pair channel and are in parallel to form the resistive termination at the input to the redriver. The values of the resistors can be chosen so that the nominal value of the parallel resistance of $R_{in1\_p}$ and $R_{in2\_p}$ is equal to the line impedance as defined by the respective interconnect specification (e.g., 42.5 ohms in UPI); the resistance value of $R_{in2\_p}$ is within the transmitter adjustment range for a correct DC common-mode level; and the same values will be used for $R_{in1\_n}$ and $R_{in2\_n}$, the resistors on the complementary leg of the differential pair. As one example, for a 50 ohm line impedance, the resistive values of the four redriver resistors can be $R_{in1\_p}=R_{in2\_p}=R_{in1\_n}=R_{in2\_n}=100$ ohms, although other resistance values may be used.

Further, values of pulldown resistors 1425 can be selected not only for line impedance matching, but also based on the properties of the pulldown detection circuitry employed at the transmitter 1110. For instance, to generate the preferred or defined pulldown voltage "signal" to be detected by the transmitter 1110 detection circuitry, a larger variance between resistor values of the pulldown resistors (e.g., 1425) and detection resistors (e.g., 1410) can be desired. The detection resistors (e.g., 1410), $R_{u1\_p}$ and $R_{d1\_p}$, can effectively form a voltage divider with pulldown resistors $R_{in2\_p}$ and $R_{in2\_n}$ (1425) in detection mode (e.g., when there is no signaling on the lanes). When no pulldown voltage is present, voltage detected by the transmitter's 1110 detection circuitry can be interpreted as a logical "1", with a pulldown voltage being interpreted as a logical "0" (indicating presence of a companion endpoint). Further, values of these detection resistors $R_{u1\_p}$ and $R_{d1\_p}$ (1410) can be selected (e.g., in the kohm range) so as to have little impact on the termination impedance of the transmitter (and draw little to no current during active signaling).

In the examples above, a low impedance DC termination can always be present at the input of an enhanced AC-coupled re-driver 1205 (e.g., through the provisioning of pull down resistors 1425). Accordingly, the enhanced re-driver can effectively always be in the active mode, so that, at the time of link initialization or after a reset, a UPI Tx endpoint (e.g., 1110) always sees a low impedance termination, starts Tx calibration, and then transmits training patterns. Without the redriver, conventional receiver detection acts as a handshake to assist in synchronizing the two endpoints. For instance, when the endpoint device enters an Rx Detect link state, the endpoint can wait until it sees a pulldown voltage on the line (and detects the remote receiver endpoint). Detection of the remote receiver endpoint can correspond to the remote receiver endpoint also entering the Rx Detect (or other corresponding) link state. In implementations utilizing an enhanced re-driver, however, the transmitter endpoint will detect the redriver terminations and move to subsequent link states where training sequences are exchanged. Handshaking to synchronize the two endpoints can then be accomplished through the exchange of training sequences in other link states, among other examples. sides then gets done thru the training sequences.

Figure 16:
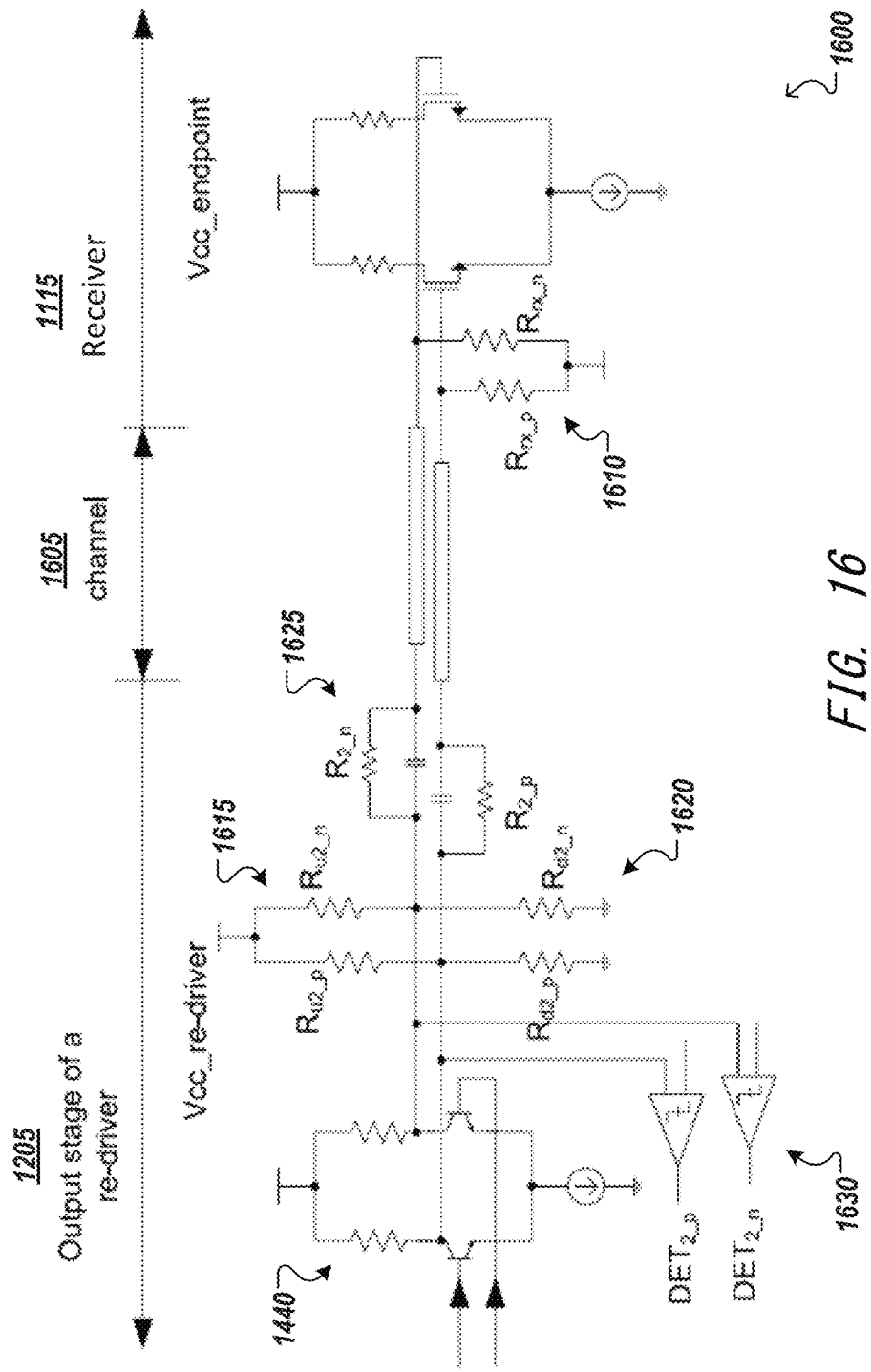
FIG. 16 illustrates a simplified circuit diagram representing an example implementation of an output stage of a redriver connected to another endpoint.

Turning to FIG. 16, a circuit diagram 1600 is shown illustrating pulldown detection circuitry to be provided with an enhanced redriver, such as introduced in the example of FIG. 13. In FIG. 16, a first example implementation of circuitry to enable presence detection between the between the output stage of a re-driver 1205 and a UPI Rx endpoint device 1115 is shown. In this example, circuity is provide d with the redriver to allow the redriver output to detect if the UPI Rx device is present on the link (e.g., 1605). In essence, the circuitry is similar to that employed in pulldown detection logic of the UPI Tx device, as both the enhanced redriver 1205 and Tx endpoint (e.g., 1110) are to be configured to detect an expected pulldown voltage corresponding to a remote endpoint termination. In this particular example, $R_{rx\_p}$ and $R_{rx\_n}$ (1610) are the on-chip pulldown termination resistors at the Rx endpoint 1115, and (as with the pulldown logic provided at the enhanced redriver) the nominal value of the Rx endpoint's resistors 1610 can be equal to or approximate the line impedance (e.g., 42.5 ohms).

Pulldown voltage detection circuitry of the redriver 1205 can include pull-up resistors, $R_{u2\_p}$ and $R_{u2\_n}$ (1615), which, in this example, are internal to the redriver chip 1205. Redriver pull-up resistors $R_{u2\_p}$ and $R_{u2\_n}$ (1615), in one implementation, can have relatively high resistor values (e.g., in the kilo ohm ranges). Additionally, pulldown voltage detection circuitry of the redriver 1205 can further include resistors $R_{d2\_p}$ and $R_{d2\_n}$ (1620) and $R_{2\_n}$ and $R_{2\_p}$ (at 1625), which, together with the pull-up resistors $R_{u2\_p}$ and $R_{u2\_n}$ (1615), form a resistive voltage divider, or ladder. The resistor network in the redriver pulldown voltage detection circuitry can prevent the DC voltage from exceeding defined maximum levels when the low impedance termination at the receiver endpoint is not present. $R_{2\_p}$ and $R_{2\_n}$ can be provided on-board, added in parallel to the DC-blocking capacitors (at 1625) to provide the DC path during detection mode. For instance, when in detection mode (and in the absence of high speed signaling on the channel 1605) the capacitors can act as open circuits, with $R_{2\_p}$ and $R_{2\_n}$ providing the DC path around the capacitors. In some cases, the resistance of $R_{2\_p}$ and $R_{2\_n}$ can be relatively high (e.g., in the kilo ohms range), so that they have little impact to the active state high speed signals (resembling AC signals traversing over the capacitors (which resemble short circuits during high speed signaling)). In some cases, resistors $R_{2\_p}$ and $R_{2\_n}$ and the corresponding DC-blocking capacitors can be provided off the redriver chip 1205, with the remaining pulldown detection circuitry (e.g., 1615, 1620) provided on-chip. Alternatively, the DC-blocking capacitors and the resistors in parallel (at 1625) can be integrated into the redriver design with the other pulldown detection circuitry to simplify the board layout, among other considerations.

As should be appreciated, a remote termination may not always be present at the receiver pins of the redriver 1205. For instance, in implementations, such as hot plugging, the Rx endpoint device may sometimes not be present on the line, complicating the use of a redriver on the channel. When the remote endpoint is not present (e.g., in a hot plug scenario) the Tx endpoint will keep trying to proceed through initialization, but will always fail (due to the absence of a downstream remote receiver endpoint), resulting in the reporting of an error (e.g., to system management software). To handle this more gracefully one could relay detection status from the output stage of the re-driver to the input of the re-driver, so that the Tx endpoint can correctly detect the presence of the remote Rx endpoint, such as in the example of FIG. 13.

As shown in the example of FIG. 16, pulldown detection logic of the redriver 1205 can include detection control circuitry $DET_{2\_p}$ and $DET_{2\_n}$ (1630). In the event a pulldown voltage corresponding to a remote receiver termination is detected by the pulldown detection logic of the redriver 1205, detection control circuitry $DET_{2\_p}$ and $DET_{2\_n}$ (1630) can be caused to generate a pulldown detection signal. The pulldown detection signal can be passed to pulldown relay logic at the receive side of the redriver 1205. For instance, turning to FIG. 17, a circuit diagram 1700 is shown including pulldown resistors 1425 at the redriver 1205 (similar to the examples of FIGS. 14-15) and including switching logic 1705 coupled to the detection control circuitry $DET_{2\_p}$ and $DET_{2\_n}$ (1630) of the redriver 1205 to selectively "activate" or "enable" the redriver's 1205 pulldown resistors 1425.

In this example, when the output stage of the re-driver detects the presence of the Rx endpoint, pulldown detection signals are fed to the switching logic 1705 to turn on switches $S_p$ and $S_n$, and, in turn, establish a DC current path to "pull down" current through the pulldown resistors 1425. This causes a voltage step to appear at the re-driver input pins and this voltage step propagates down the channel 1420 to the output pins (and pulldown voltage detection logic) of the Tx endpoint 1110. Given the orientation of the pulldown resistors 1425 and AC coupling capacitors 1435, turning on switches $S_p$ and $S_n$ will create a voltage step commensurate with a resistor-capacitor (RC) time constant corresponding to values of redriver resistors $R_{u1\_p}$ and $R_{u1\_n}$, $R_{in1\_p}$ and $R_{in1\_n}$, and $R_{in2\_p}$ and $R_{in\_n}$ and the AC coupling capacitors 1435. For instance, the voltage produced at the redriver's 1205 receive pins (and detected at the Tx endpoint's 1110 output pins) will eventually settle back to $V_{cc\_EndPoint}$ due to the nature of the RC time constant.

Accordingly, to generate a voltage step with characteristics capable of being interpreted as pulldown voltage of a remote receiver termination, appropriate values of redriver resistors and AC coupling capacitors 1435 can be selected to realize a time constant that enables such a voltage step. Values of the capacitors and resistors can be selected, in such implementations, so that the time constant is long enough to complete the Rx detection and start initialization. For instance, in some implementations, the Rx Detect state may be defined such that positive detection results when the pulldown voltage is present (and detected) over a minimum time duration. Accordingly, the time constant can be selected to correspond with the definition of the Rx Detect state. When the receiver device termination is successfully relayed to the transmitting endpoint 1110 over the redriver 1205, forward progress can continue and remaining initialization steps can be completed. In some instances, these subsequent initialization steps may no longer involve receiver detection and can allow pulldown voltage detection circuitry in the Tx endpoint (and redriver) to be turned off In some implementations, following completion of a detect state and transition to a signaling state (e.g., a subsequent configuration link state or an active link state), resistors (e.g., 1430) of the redriver 1205 used for impedance matching can be "turned on", as the AC coupling capacitors are "shorted" through the incoming high-speed signals. In one example, the redriver 1205 can be provided with electrical idle detection that is capable of sensing the amplitude of the transmitted high speed data. Such logic can be used to turn on the main driver circuitry (e.g., 1440) of the redriver 1205 (including the impedance matching termination) to allow the redriver 1205 to fully transition from a pulldown detection and relay mode to its core signal redriving mode. Further, the switches $S_p$, $S_n$ can then be off as the initialization is complete.

Figure 17:
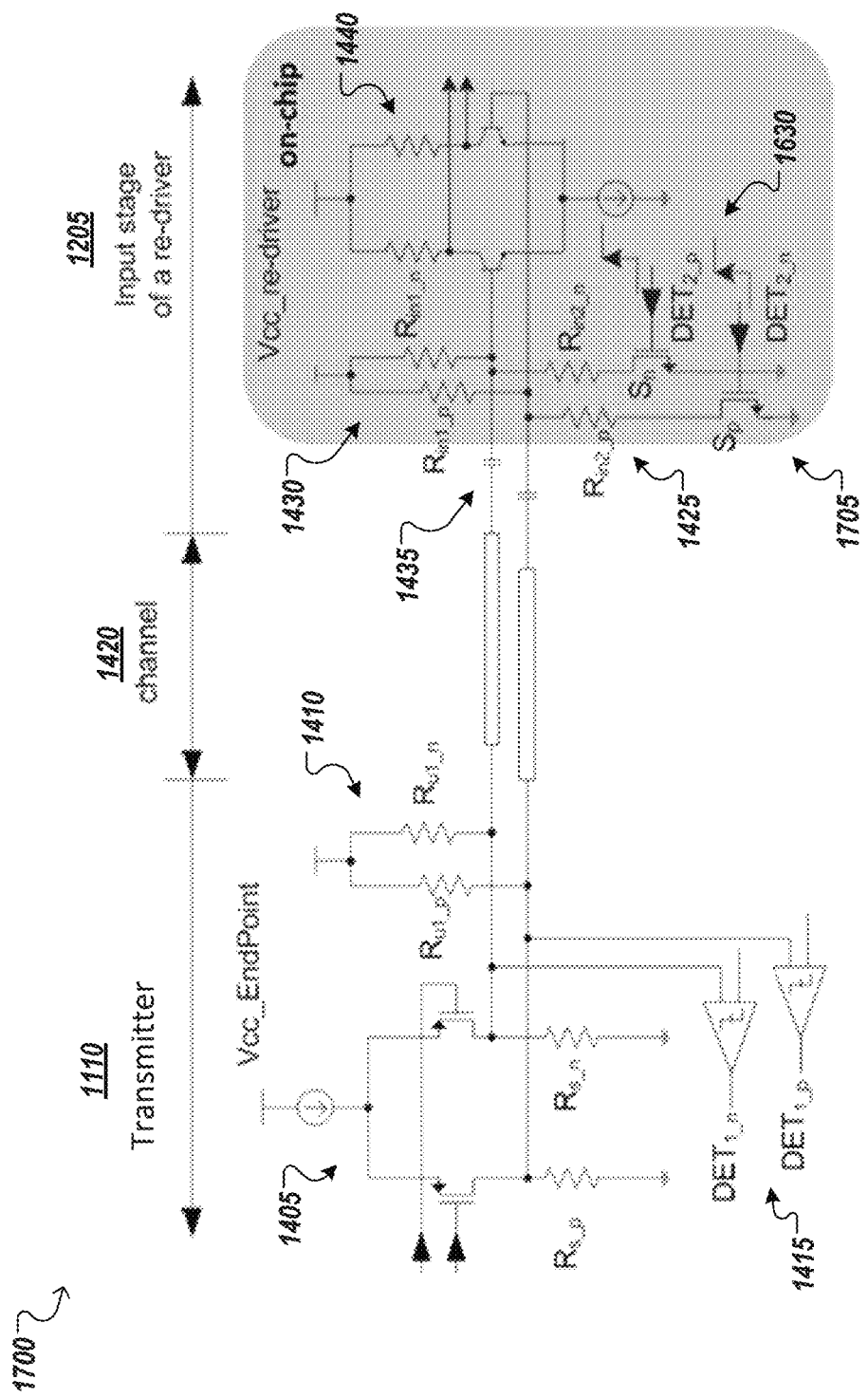
FIG. 17 illustrates a simplified circuit diagram representing a first implementation of detection relay circuitry of an example redriver.

While the example of FIG. 17 shows the AC-coupling/DC-blocking capacitors 1435 off-chip (and on-board), alternative designs can provide the DC-blocking capacitors 1435 in package or on chip. In instances where the capacitors are on chip, DC wandering correction circuitry and other components may be provided.

Figure 18:
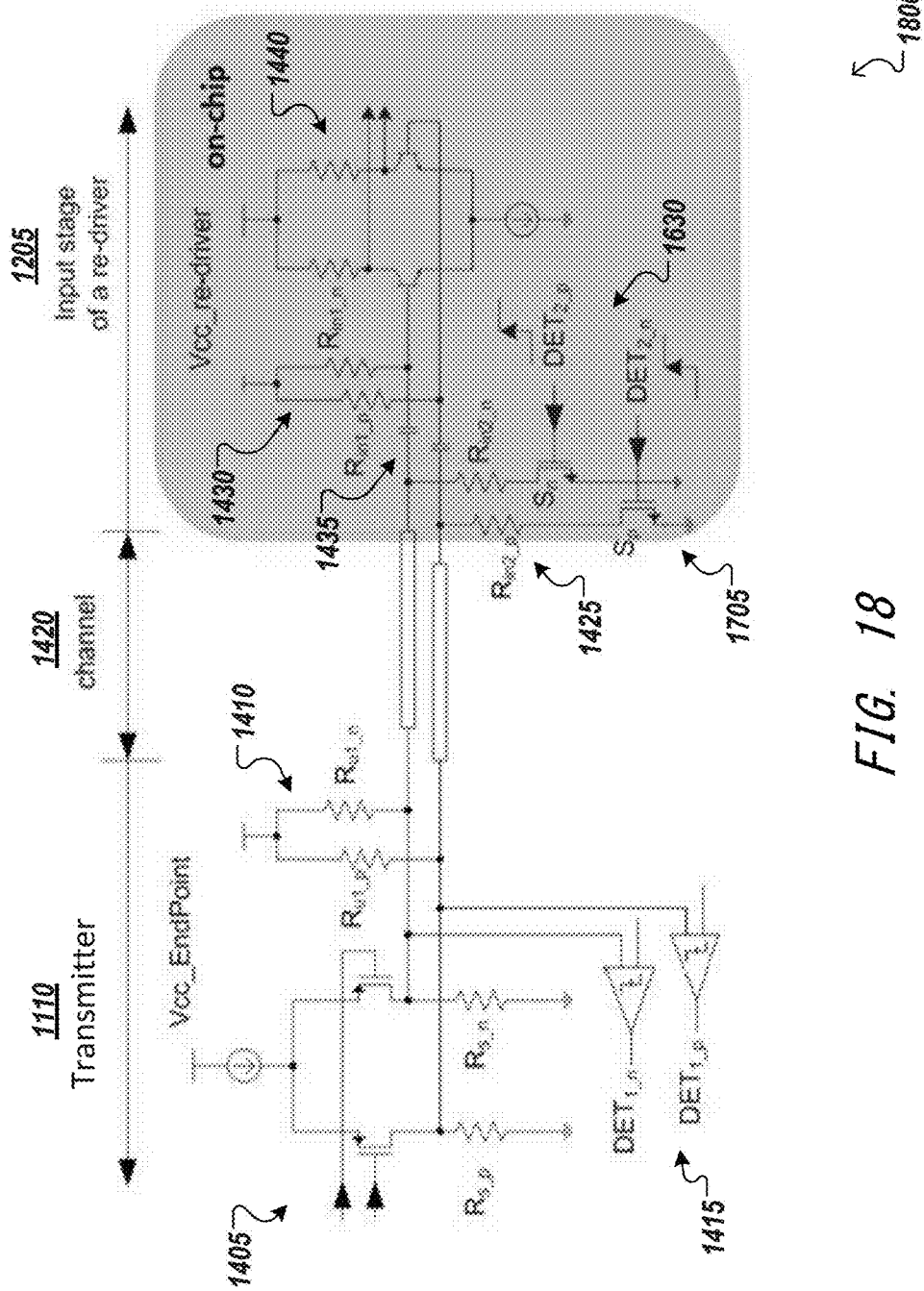
FIG. 18 illustrates a simplified circuit diagram representing a second implementation of detection relay circuitry of an example redriver.

Turning to FIG. 18, a circuit diagram 1800 is shown, similar to that shown and described in connection with the example of FIG. 17. In the example of FIG. 18, direct DC path detection can be used by a redriver 1205 for relaying Rx endpoint detection to a corresponding Tx endpoint (e.g., 1110). In this case, when the output stage of the re-driver detects the presence of the Rx endpoint, detection control circuitry $DET_{2\_p}$ and $DET_{2\_n}$ (1630) can again generate pulldown detection signals to turn on switches $S_p$ and $S_n$, resulting in a DC current path being established between $R_{u1\_p}$ and $R_{in2\_p}$, and $R_{u1\_n}$ and $R_{in2\_n}$, and causing a substantially steady pulldown voltage to manifest at the input pins of the redriver 1205. The pulldown voltage propagates to the output pins of the Tx endpoint, which triggers the detect circuit in the Tx endpoint as if there is a receiver DC low-impedance at the input of the redriver. As in preceding examples, detection of the pulldown voltage can allow further link initialization steps to proceed. Further, in the example shown in FIG. 18, each of the switching logic 1705 and corresponding pulldown resistors 1425 can be provided on-chip or on-package with redriver circuitry 1440. In some cases, this can result in also provisioning the AC coupling capacitors 1435 on chip with the remaining redriver pulldown relay logic, among other examples.

It should be appreciated that other details and features can be provided in a high-performance interconnect including implementations that utilize an optical link to extend a physical channel. For instance, a portion of the channel can be optical, rather than electrical. For instance, multiple redrivers can be provided in series and a portion of the channel between the redrivers can be optical. In the case of a "chain" of redrivers, each redriver in the chain can possess pulldown detection and pulldown relay logic to allow a pulldown voltage generated by termination of an endpoint receiver to propagate through the chain to an endpoint transmitter, consistent with the examples above. Further, a high-performance interconnect (HPI) such as UPI can apply one or more features and principles described in U.S. patent application Ser. No. 14/060,191, entitled "High Performance Interconnect," which is incorporated herein by reference.

UPI can be incorporated in any variety of computing devices and systems, including mainframes, server systems, personal computers, mobile computers (such as tablets, smartphones, personal digital systems, etc.), smart appliances, gaming or entertainment consoles and set top boxes, among other examples. For instance, referring to FIG. 19, an embodiment of a block diagram for a computing system including a multicore processor is depicted. Processor 1900 includes any processor or processing device, such as a microprocessor, an embedded processor, a digital signal processor (DSP), a network processor, a handheld processor, an application processor, a co-processor, a system on a chip (SOC), or other device to execute code. Processor 1900, in one embodiment, includes at least two cores—core 1901 and 1902, which may include asymmetric cores or symmetric cores (the illustrated embodiment). However, processor 1900 may include any number of processing elements that may be symmetric or asymmetric.

In one embodiment, a processing element refers to hardware or logic to support a software thread. Examples of hardware processing elements include: a thread unit, a thread slot, a thread, a process unit, a context, a context unit, a logical processor, a hardware thread, a core, and/or any other element, which is capable of holding a state for a processor, such as an execution state or architectural state. In other words, a processing element, in one embodiment, refers to any hardware capable of being independently associated with code, such as a software thread, operating system, application, or other code. A physical processor (or processor socket) typically refers to an integrated circuit, which potentially includes any number of other processing elements, such as cores or hardware threads.

A core often refers to logic located on an integrated circuit capable of maintaining an independent architectural state, wherein each independently maintained architectural state is associated with at least some dedicated execution resources. In contrast to cores, a hardware thread typically refers to any logic located on an integrated circuit capable of maintaining an independent architectural state, wherein the independently maintained architectural states share access to execution resources. As can be seen, when certain resources are shared and others are dedicated to an architectural state, the line between the nomenclature of a hardware thread and core overlaps. Yet often, a core and a hardware thread are viewed by an operating system as individual logical processors, where the operating system is able to individually schedule operations on each logical processor.

Figure 19:
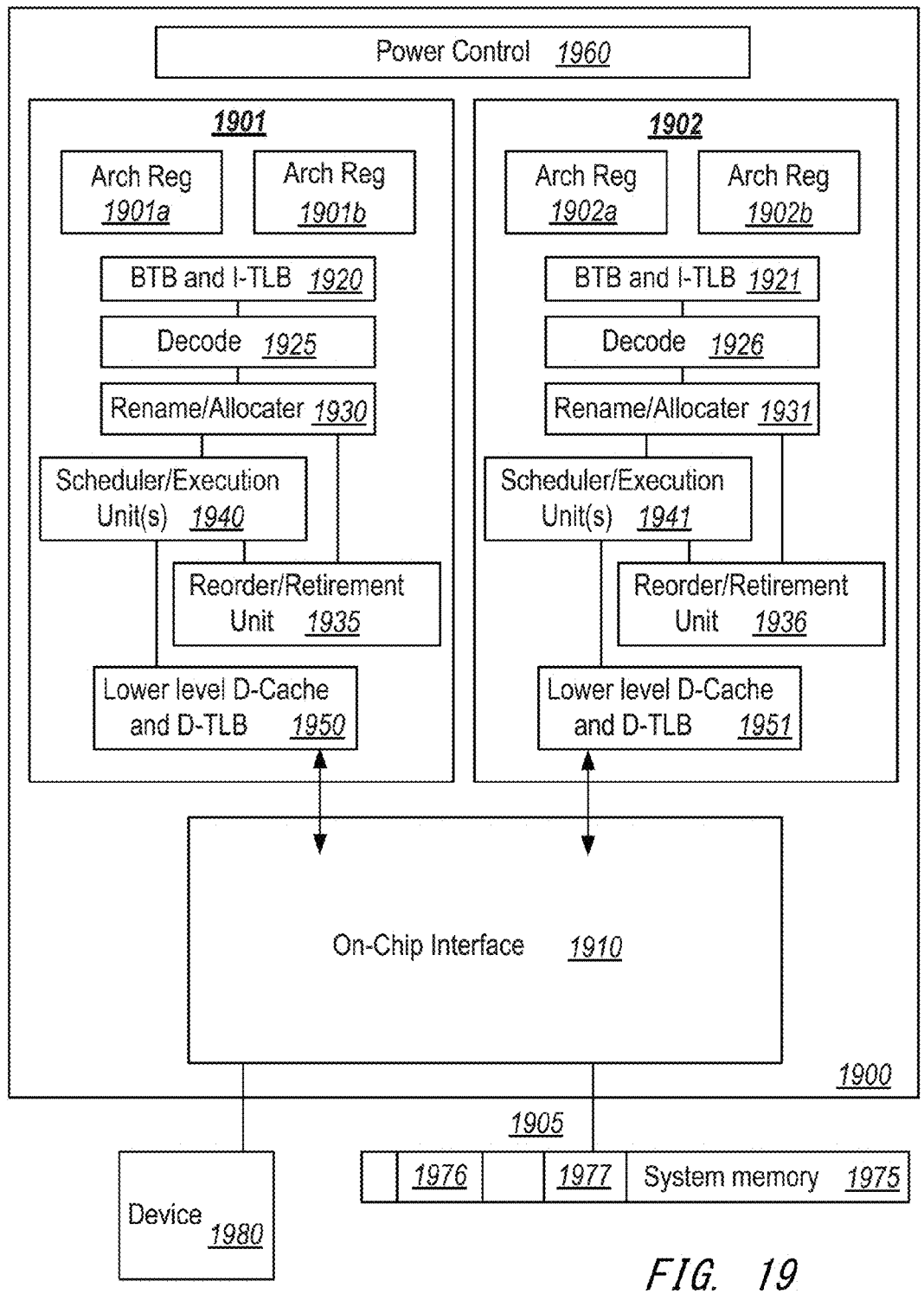
FIG. 19 illustrates an embodiment of a block diagram for a computing system including a multicore processor.

Physical processor 1900, as illustrated in FIG. 19, includes two cores—core 1901 and 1902. Here, core 1901 and 1902 are considered symmetric cores, i.e. cores with the same configurations, functional units, and/or logic. In another embodiment, core 1901 includes an out-of-order processor core, while core 1902 includes an in-order processor core. However, cores 1901 and 1902 may be individually selected from any type of core, such as a native core, a software managed core, a core adapted to execute a native Instruction Set Architecture (ISA), a core adapted to execute a translated Instruction Set Architecture (ISA), a co-designed core, or other known core. In a heterogeneous core environment (i.e. asymmetric cores), some form of translation, such a binary translation, may be utilized to schedule or execute code on one or both cores. Yet to further the discussion, the functional units illustrated in core 1901 are described in further detail below, as the units in core 1902 operate in a similar manner in the depicted embodiment.

As depicted, core 1901 includes two hardware threads 1901*a* and 1901*b*, which may also be referred to as hardware thread slots 1901*a* and 1901*b*. Therefore, software entities, such as an operating system, in one embodiment potentially view processor 1900 as four separate processors, i.e., four logical processors or processing elements capable of executing four software threads concurrently. As alluded to above, a first thread is associated with architecture state registers 1901*a*, a second thread is associated with architecture state registers 1901*b*, a third thread may be associated with architecture state registers 1902*a*, and a fourth thread may be associated with architecture state registers 1902*b*. Here, each of the architecture state registers (1901*a*, 1901*b*, 1902*a*, and 1902*b*) may be referred to as processing elements, thread slots, or thread units, as described above. As illustrated, architecture state registers 1901*a* are replicated in architecture state registers 1901*b*, so individual architecture states/contexts are capable of being stored for logical processor 1901*a* and logical processor 1901*b*. In core 1901, other smaller resources, such as instruction pointers and renaming logic in allocator and renamer block 1930 may also be replicated for threads 1901*a* and 1901*b*. Some resources, such as re-order buffers in reorder/retirement unit 1935, ILTB 1920, load/store buffers, and queues may be shared through partitioning. Other resources, such as general purpose internal registers, page-table base register(s), low-level data-cache and data-TLB 1915, execution unit(s) 1940, and portions of out-of-order unit 1935 are potentially fully shared.

Processor 1900 often includes other resources, which may be fully shared, shared through partitioning, or dedicated by/to processing elements. In FIG. 19, an embodiment of a purely exemplary processor with illustrative logical units/resources of a processor is illustrated. Note that a processor may include, or omit, any of these functional units, as well as include any other known functional units, logic, or firmware not depicted. As illustrated, core 1901 includes a simplified, representative out-of-order (OOO) processor core. But an in-order processor may be utilized in different embodiments. The OOO core includes a branch target buffer 1920 to predict branches to be executed/taken and an instruction-translation buffer (I-TLB) 1920 to store address translation entries for instructions.

Core 1901 further includes decode module 1925 coupled to fetch unit 1920 to decode fetched elements. Fetch logic, in one embodiment, includes individual sequencers associated with thread slots 1901*a*, 1901*b*, respectively. Usually core 1901 is associated with a first ISA, which defines/specifies instructions executable on processor 1900. Often machine code instructions that are part of the first ISA include a portion of the instruction (referred to as an opcode), which references/specifies an instruction or operation to be performed. Decode logic 1925 includes circuitry that recognizes these instructions from their opcodes and passes the decoded instructions on in the pipeline for processing as defined by the first ISA. For example, as discussed in more detail below decoders 1925, in one embodiment, include logic designed or adapted to recognize specific instructions, such as transactional instruction. As a result of the recognition by decoders 1925, the architecture or core 1901 takes specific, predefined actions to perform tasks associated with the appropriate instruction. It is important to note that any of the tasks, blocks, operations, and methods described herein may be performed in response to a single or multiple instructions; some of which may be new or old instructions. Note decoders 1926, in one embodiment, recognize the same ISA (or a subset thereof). Alternatively, in a heterogeneous core environment, decoders 1926 recognize a second ISA (either a subset of the first ISA or a distinct ISA).

In one example, allocator and renamer block 1930 includes an allocator to reserve resources, such as register files to store instruction processing results. However, threads 1901*a* and 1901*b* are potentially capable of out-of-order execution, where allocator and renamer block 1930 also reserves other resources, such as reorder buffers to track instruction results. Unit 1930 may also include a register renamer to rename program/instruction reference registers to other registers internal to processor 1900. Reorder/retirement unit 1935 includes components, such as the reorder buffers mentioned above, load buffers, and store buffers, to support out-of-order execution and later in-order retirement of instructions executed out-of-order.

Scheduler and execution unit(s) block 1940, in one embodiment, includes a scheduler unit to schedule instructions/operation on execution units. For example, a floating point instruction is scheduled on a port of an execution unit that has an available floating point execution unit. Register files associated with the execution units are also included to store information instruction processing results. Exemplary execution units include a floating point execution unit, an integer execution unit, a jump execution unit, a load execution unit, a store execution unit, and other known execution units.

Lower level data cache and data translation buffer (D-TLB) 1950 are coupled to execution unit(s) 1940. The data cache is to store recently used/operated on elements, such as data operands, which are potentially held in memory coherency states. The D-TLB is to store recent virtual/linear to physical address translations. As a specific example, a processor may include a page table structure to break physical memory into a plurality of virtual pages.

Here, cores 1901 and 1902 share access to higher-level or further-out cache, such as a second level cache associated with on-chip interface 1910. Note that higher-level or further-out refers to cache levels increasing or getting further way from the execution unit(s). In one embodiment, higher-level cache is a last-level data cache—last cache in the memory hierarchy on processor 1900—such as a second or third level data cache. However, higher level cache is not so limited, as it may be associated with or include an instruction cache. A trace cache—a type of instruction cache—instead may be coupled after decoder 1925 to store recently decoded traces. Here, an instruction potentially refers to a macro-instruction (i.e. a general instruction recognized by the decoders), which may decode into a number of micro-instructions (micro-operations).

In the depicted configuration, processor 1900 also includes on-chip interface module 1910. Historically, a memory controller, which is described in more detail below, has been included in a computing system external to processor 1900. In this scenario, on-chip interface 1910 is to communicate with devices external to processor 1900, such as system memory 1975, a chipset (often including a memory controller hub to connect to memory 1975 and an I/O controller hub to connect peripheral devices), a memory controller hub, a northbridge, or other integrated circuit. And in this scenario, bus 1905 may include any known interconnect, such as multi-drop bus, a point-to-point interconnect, a serial interconnect, a parallel bus, a coherent (e.g. cache coherent) bus, a layered protocol architecture, a differential bus, and a GTL bus.

Memory 1975 may be dedicated to processor 1900 or shared with other devices in a system. Common examples of types of memory 1975 include DRAM, SRAM, non-volatile memory (NV memory), and other known storage devices. Note that device 1980 may include a graphic accelerator, processor or card coupled to a memory controller hub, data storage coupled to an I/O controller hub, a wireless transceiver, a flash device, an audio controller, a network controller, or other known device.

Recently however, as more logic and devices are being integrated on a single die, such as SOC, each of these devices may be incorporated on processor 1900. For example in one embodiment, a memory controller hub is on the same package and/or die with processor 1900. Here, a portion of the core (an on-core portion) 1910 includes one or more controller(s) for interfacing with other devices such as memory 1975 or a graphics device 1980. The configuration including an interconnect and controllers for interfacing with such devices is often referred to as an on-core (or un-core configuration). As an example, on-chip interface 1910 includes a ring interconnect for on-chip communication and a high-speed serial point-to-point link 1905 for off-chip communication. Yet, in the SOC environment, even more devices, such as the network interface, co-processors, memory 1975, graphics processor 1980, and any other known computer devices/interface may be integrated on a single die or integrated circuit to provide small form factor with high functionality and low power consumption.

In one embodiment, processor 1900 is capable of executing a compiler, optimization, and/or translator code 1977 to compile, translate, and/or optimize application code 1976 to support the apparatus and methods described herein or to interface therewith. A compiler often includes a program or set of programs to translate source text/code into target text/code. Usually, compilation of program/application code with a compiler is done in multiple phases and passes to transform hi-level programming language code into low-level machine or assembly language code. Yet, single pass compilers may still be utilized for simple compilation. A compiler may utilize any known compilation techniques and perform any known compiler operations, such as lexical analysis, preprocessing, parsing, semantic analysis, code generation, code transformation, and code optimization.

Larger compilers often include multiple phases, but most often these phases are included within two general phases: (1) a front-end, i.e. generally where syntactic processing, semantic processing, and some transformation/optimization may take place, and (2) a back-end, i.e. generally where analysis, transformations, optimizations, and code generation takes place. Some compilers refer to a middle, which illustrates the blurring of delineation between a front-end and back end of a compiler. As a result, reference to insertion, association, generation, or other operation of a compiler may take place in any of the aforementioned phases or passes, as well as any other known phases or passes of a compiler. As an illustrative example, a compiler potentially inserts operations, calls, functions, etc. in one or more phases of compilation, such as insertion of calls/operations in a front-end phase of compilation and then transformation of the calls/operations into lower-level code during a transformation phase. Note that during dynamic compilation, compiler code or dynamic optimization code may insert such operations/calls, as well as optimize the code for execution during runtime. As a specific illustrative example, binary code (already compiled code) may be dynamically optimized during runtime. Here, the program code may include the dynamic optimization code, the binary code, or a combination thereof.

Similar to a compiler, a translator, such as a binary translator, translates code either statically or dynamically to optimize and/or translate code. Therefore, reference to execution of code, application code, program code, or other software environment may refer to: (1) execution of a compiler program(s), optimization code optimizer, or translator either dynamically or statically, to compile program code, to maintain software structures, to perform other operations, to optimize code, or to translate code; (2) execution of main program code including operations/calls, such as application code that has been optimized/compiled; (3) execution of other program code, such as libraries, associated with the main program code to maintain software structures, to perform other software related operations, or to optimize code; or (4) a combination thereof.

Figure 20:
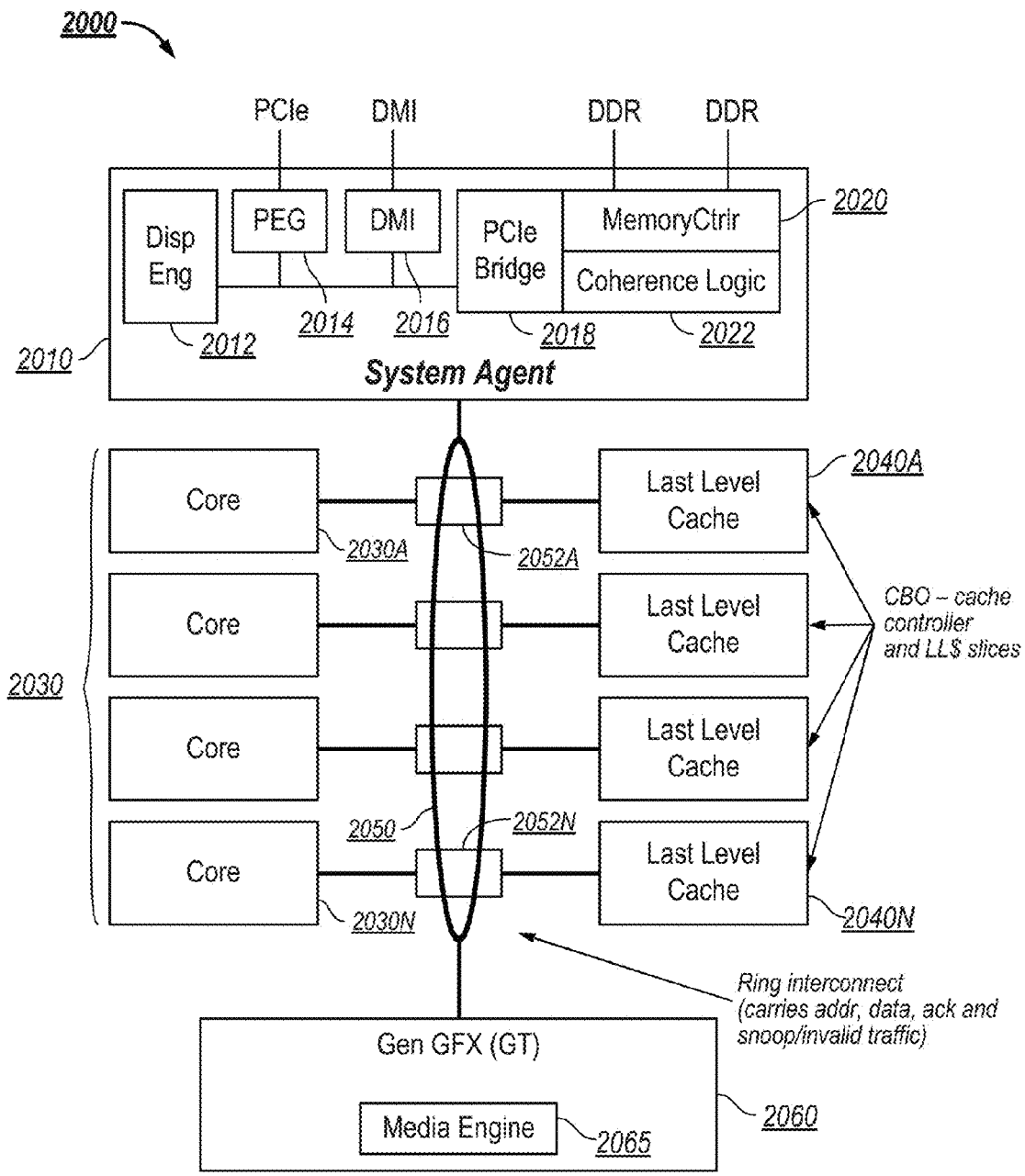
FIG. 20 illustrates another embodiment of a block diagram for a computing system including a multicore processor.

Referring now to FIG. 20, shown is a block diagram of an embodiment of a multicore processor. As shown in the embodiment of FIG. 20, processor 2000 includes multiple domains. Specifically, a core domain 2030 includes a plurality of cores 2030A-2030N, a graphics domain 2060 includes one or more graphics engines having a media engine 2065, and a system agent domain 2010.

In various embodiments, system agent domain 2010 handles power control events and power management, such that individual units of domains 2030 and 2060 (e.g. cores and/or graphics engines) are independently controllable to dynamically operate at an appropriate power mode/level (e.g. active, turbo, sleep, hibernate, deep sleep, or other Advanced Configuration Power Interface like state) in light of the activity (or inactivity) occurring in the given unit. Each of domains 2030 and 2060 may operate at different voltage and/or power, and furthermore the individual units within the domains each potentially operate at an independent frequency and voltage. Note that while only shown with three domains, understand the scope of the present disclosure is not limited in this regard and additional domains may be present in other embodiments.

As shown, each core 2030 further includes low level caches in addition to various execution units and additional processing elements. Here, the various cores are coupled to each other and to a shared cache memory that is formed of a plurality of units or slices of a last level cache (LLC) 2040A-2040N; these LLCs often include storage and cache controller functionality and are shared amongst the cores, as well as potentially among the graphics engine too.

As seen, a ring interconnect 2050 couples the cores together, and provides interconnection between the core domain 2030, graphics domain 2060 and system agent circuitry 2010, via a plurality of ring stops 2052A-2052N, each at a coupling between a core and LLC slice. As seen in FIG. 20, interconnect 2050 is used to carry various information, including address information, data information, acknowledgement information, and snoop/invalid information. Although a ring interconnect is illustrated, any known on-die interconnect or fabric may be utilized. As an illustrative example, some of the fabrics discussed above (e.g. another on-die interconnect, On-chip System Fabric (OSF), an Advanced Microcontroller Bus Architecture (AMBA) interconnect, a multi-dimensional mesh fabric, or other known interconnect architecture) may be utilized in a similar fashion.

As further depicted, system agent domain 2010 includes display engine 2012 which is to provide control of and an interface to an associated display. System agent domain 2010 may include other units, such as: an integrated memory controller 2020 that provides for an interface to a system memory (e.g., a DRAM implemented with multiple DIMMs; coherence logic 2022 to perform memory coherence operations. Multiple interfaces may be present to enable interconnection between the processor and other circuitry. For example, in one embodiment at least one direct media interface (DMI) 2016 interface is provided as well as one or more PCIe™ interfaces 2014. The display engine and these interfaces typically couple to memory via a PCIe™ bridge 2018. Still further, to provide for communications between other agents, such as additional processors or other circuitry, one or more other interfaces may be provided.

Figure 21:
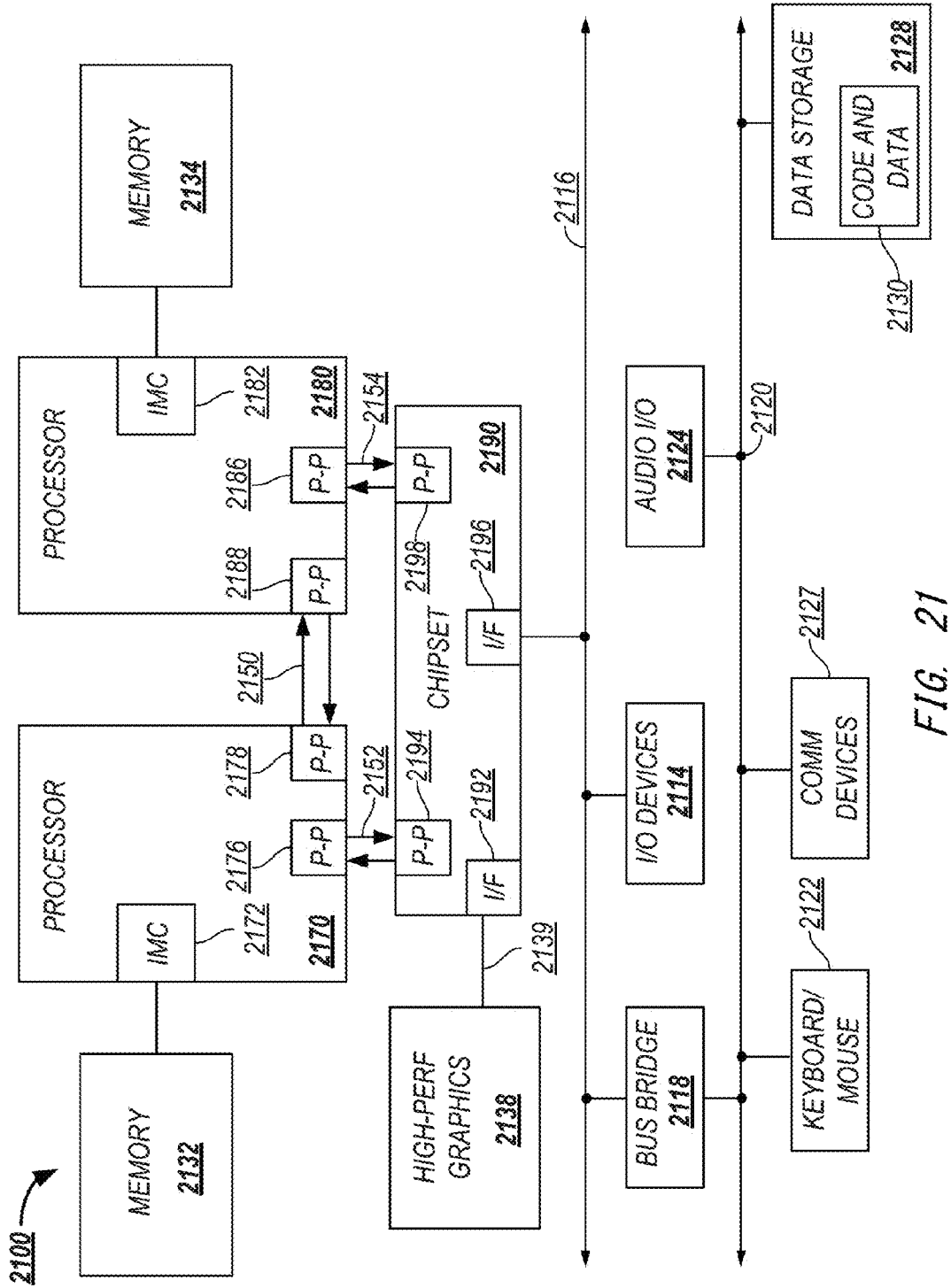
FIG. 21 illustrates an embodiment of a block for a computing system including multiple processor sockets.

Referring now to FIG. 21, shown is a block diagram of a second system 2100 in accordance with an embodiment of the present disclosure. As shown in FIG. 21, multiprocessor system 2100 is a point-to-point interconnect system, and includes a first processor 2170 and a second processor 2180 coupled via a point-to-point interconnect 2150. Each of processors 2170 and 2180 may be some version of a processor. In one embodiment, 2152 and 2154 are part of a serial, point-to-point coherent interconnect fabric, such as a high-performance architecture. As a result, the concepts described herein may be implemented within the UPI architecture.

While shown with only two processors 2170, 2180, it is to be understood that the scope of the present disclosure is not so limited. In other embodiments, one or more additional processors may be present in a given processor.

Processors 2170 and 2180 are shown including integrated memory controller units 2172 and 2182, respectively. Processor 2170 also includes as part of its bus controller units point-to-point (P-P) interfaces 2176 and 2178; similarly, second processor 2180 includes P-P interfaces 2186 and 2188. Processors 2170, 2180 may exchange information via a point-to-point (P-P) interface 2150 using P-P interface circuits 2178, 2188. As shown in FIG. 21, IMCs 2172 and 2182 couple the processors to respective memories, namely a memory 2132 and a memory 2134, which may be portions of main memory locally attached to the respective processors.

Processors 2170, 2180 each exchange information with a chipset 2190 via individual P-P interfaces 2152, 2154 using point to point interface circuits 2176, 2194, 2186, 2198. Chipset 2190 also exchanges information with a high-performance graphics circuit 2138 via an interface circuit 2192 along a high-performance graphics interconnect 2139.

A shared cache (not shown) may be included in either processor or outside of both processors; yet connected with the processors via P-P interconnect, such that either or both processors' local cache information may be stored in the shared cache if a processor is placed into a low power mode.

Chipset 2190 may be coupled to a first bus 2116 via an interface 2196. In one embodiment, first bus 2116 may be a Peripheral Component Interconnect (PCI) bus, or a bus such as a PCI Express bus or another third generation I/O interconnect bus, although the scope of the present disclosure is not so limited.

As shown in FIG. 21, various I/O devices 2114 are coupled to first bus 2116, along with a bus bridge 2118 which couples first bus 2116 to a second bus 2120. In one embodiment, second bus 2120 includes a low pin count (LPC) bus. Various devices are coupled to second bus 2120 including, for example, a keyboard and/or mouse 2122, communication devices 2127 and a storage unit 2128 such as a disk drive or other mass storage device which often includes instructions/code and data 2130, in one embodiment. Further, an audio I/O 2124 is shown coupled to second bus 2120. Note that other architectures are possible, where the included components and interconnect architectures vary. For example, instead of the point-to-point architecture of FIG. 21, a system may implement a multi-drop bus or other such architecture.

While the concepts herein have been described with respect to a limited number of embodiments, those skilled in the art will appreciate numerous modifications and variations therefrom. It is intended that the appended claims cover all such modifications and variations as fall within the true spirit and scope of this present disclosure.

A design may go through various stages, from creation to simulation to fabrication. Data representing a design may represent the design in a number of manners. First, as is useful in simulations, the hardware may be represented using a hardware description language (HDL) or another functional description language. Additionally, a circuit level model with logic and/or transistor gates may be produced at some stages of the design process. Furthermore, most designs, at some stage, reach a level of data representing the physical placement of various devices in the hardware model. In the case where conventional semiconductor fabrication techniques are used, the data representing the hardware model may be the data specifying the presence or absence of various features on different mask layers for masks used to produce the integrated circuit. In some implementations, such data may be stored in a database file format such as Graphic Data System II (GDS II), Open Artwork System Interchange Standard (OASIS), or similar format.

In some implementations, software based hardware models, and HDL and other functional description language objects can include register transfer language (RTL) files, among other examples. Such objects can be machine-parsable such that a design tool can accept the HDL object (or model), parse the HDL object for attributes of the described hardware, and determine a physical circuit and/or on-chip layout from the object. The output of the design tool can be used to manufacture the physical device. For instance, a design tool can determine configurations of various hardware and/or firmware elements from the HDL object, such as bus widths, registers (including sizes and types), memory blocks, physical link paths, fabric topologies, among other attributes that would be implemented in order to realize the system modeled in the HDL object. Design tools can include tools for determining the topology and fabric configurations of system on chip (SoC) and other hardware device. In some instances, the HDL object can be used as the basis for developing models and design files that can be used by manufacturing equipment to manufacture the described hardware. Indeed, an HDL object itself can be provided as an input to manufacturing system software to cause the described hardware.

In any representation of the design, the data may be stored in any form of a machine readable medium. A memory or a magnetic or optical storage such as a disc may be the machine readable medium to store information transmitted via optical or electrical wave modulated or otherwise generated to transmit such information. When an electrical carrier wave indicating or carrying the code or design is transmitted, to the extent that copying, buffering, or re-transmission of the electrical signal is performed, a new copy is made. Thus, a communication provider or a network provider may store on a tangible, machine-readable medium, at least temporarily, an article, such as information encoded into a carrier wave, embodying techniques of embodiments of the present disclosure.

A module as used herein refers to any combination of hardware, software, and/or firmware. As an example, a module includes hardware, such as a micro-controller, associated with a non-transitory medium to store code adapted to be executed by the micro-controller. Therefore, reference to a module, in one embodiment, refers to the hardware, which is specifically configured to recognize and/or execute the code to be held on a non-transitory medium. Furthermore, in another embodiment, use of a module refers to the non-transitory medium including the code, which is specifically adapted to be executed by the microcontroller to perform predetermined operations. And as can be inferred, in yet another embodiment, the term module (in this example) may refer to the combination of the microcontroller and the non-transitory medium. Often module boundaries that are illustrated as separate commonly vary and potentially overlap. For example, a first and a second module may share hardware, software, firmware, or a combination thereof, while potentially retaining some independent hardware, software, or firmware. In one embodiment, use of the term logic includes hardware, such as transistors, registers, or other hardware, such as programmable logic devices.

Use of the phrase 'configured to,' in one embodiment, refers to arranging, putting together, manufacturing, offering to sell, importing and/or designing an apparatus, hardware, logic, or element to perform a designated or determined task. In this example, an apparatus or element thereof that is not operating is still 'configured to' perform a designated task if it is designed, coupled, and/or interconnected to perform said designated task. As a purely illustrative example, a logic gate may provide a 0 or a 1 during operation. But a logic gate 'configured to' provide an enable signal to a clock does not include every potential logic gate that may provide a 1 or 0. Instead, the logic gate is one coupled in some manner that during operation the 1 or 0 output is to enable the clock. Note once again that use of the term 'configured to' does not require operation, but instead focus on the latent state of an apparatus, hardware, and/or element, where in the latent state the apparatus, hardware, and/or element is designed to perform a particular task when the apparatus, hardware, and/or element is operating.

Furthermore, use of the phrases 'to,' 'capable of/to,' and or 'operable to,' in one embodiment, refers to some apparatus, logic, hardware, and/or element designed in such a way to enable use of the apparatus, logic, hardware, and/or element in a specified manner. Note as above that use of to, capable to, or operable to, in one embodiment, refers to the latent state of an apparatus, logic, hardware, and/or element, where the apparatus, logic, hardware, and/or element is not operating but is designed in such a manner to enable use of an apparatus in a specified manner.

A value, as used herein, includes any known representation of a number, a state, a logical state, or a binary logical state. Often, the use of logic levels, logic values, or logical values is also referred to as 1's and 0's, which simply represents binary logic states. For example, a 1 refers to a high logic level and 0 refers to a low logic level. In one embodiment, a storage cell, such as a transistor or flash cell, may be capable of holding a single logical value or multiple logical values. However, other representations of values in computer systems have been used. For example the decimal number ten may also be represented as a binary value of 1010 and a hexadecimal letter A. Therefore, a value includes any representation of information capable of being held in a computer system.

Moreover, states may be represented by values or portions of values. As an example, a first value, such as a logical one, may represent a default or initial state, while a second value, such as a logical zero, may represent a non-default state. In addition, the terms reset and set, in one embodiment, refer to a default and an updated value or state, respectively. For example, a default value potentially includes a high logical value, i.e. reset, while an updated value potentially includes a low logical value, i.e. set. Note that any combination of values may be utilized to represent any number of states.

The embodiments of methods, hardware, software, firmware or code set forth above may be implemented via instructions or code stored on a machine-accessible, machine readable, computer accessible, or computer readable medium which are executable by a processing element. A non-transitory machine-accessible/readable medium includes any mechanism that provides (i.e., stores and/or transmits) information in a form readable by a machine, such as a computer or electronic system. For example, a non-transitory machine-accessible medium includes random-access memory (RAM), such as static RAM (SRAM) or dynamic RAM (DRAM); ROM; magnetic or optical storage medium; flash memory devices; electrical storage devices; optical storage devices; acoustical storage devices; other form of storage devices for holding information received from transitory (propagated) signals (e.g., carrier waves, infrared signals, digital signals); etc., which are to be distinguished from the non-transitory mediums that may receive information there from.

Instructions used to program logic to perform embodiments of the disclosure may be stored within a memory in the system, such as DRAM, cache, flash memory, or other storage. Furthermore, the instructions can be distributed via a network or by way of other computer readable media. Thus a machine-readable medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage used in the transmission of information over the Internet via electrical, optical, acoustical or other forms of propagated signals (e.g., carrier waves, infrared signals, digital signals, etc.). Accordingly, the computer-readable medium includes any type of tangible machine-readable medium suitable for storing or transmitting electronic instructions or information in a form readable by a machine (e.g., a computer).

The following examples pertain to embodiments in accordance with this Specification. One or more embodiments may provide a method, a system, a machine readable storage, a machine readable medium, and an apparatus including a redriver device to receive signals from a first device and forward the signals to a second device on a differential link, detection circuitry to detect presence of the second device on the link by detecting a pulldown voltage generated from termination of the second device on the link, and pulldown relay circuitry to generate an emulated version of the pulldown voltage of the second device on pins to connect to the first device in response to detecting presence of the second device on the link.

In one example, the emulated voltage corresponds to a voltage identifiable by the first device to determine that the second device is present on the link.

In one example, the emulated voltage corresponds to a voltage defined for a receiver detect link state.

In one example, the emulated voltage is to cause a transition from the receiver detect link state to another link state defined in a link state machine.

In one example, the other link state comprises another link training state prior to entry into an active link state.

In one example, the redriver device interrupts electrical propagation of the pulldown voltage from the second device to the first device on the link.

In one example, the redriver device comprises an AC-coupled redriver and each of the first and second devices comprise DC-coupled devices.

In one example, each of the pulldown voltage and the emulated pulldown voltage comprise DC voltages.

In one example, the emulated pulldown voltage comprises a voltage pulse having a corresponding time constant.

In one example, the emulated pulldown voltage comprises a substantially steady DC signal.

In one example, a first AC-coupling capacitor is provided on a receive side of the redriver and a second AC-coupling capacitor is provided on a transmit side of the redriver.

In one example, at least one of the first and second AC-coupling capacitors is integrated in the redriver device.

In one example, the pulldown relay circuity comprises two or more pulldown resistors to generate the voltage and corresponding switches to enable generation of the emulated pulldown voltage in response to the detection of the pulldown voltage of the second device using the detection circuitry.

In one example, the pulldown relay circuity is coupled to the detection circuitry.

In one example, the second AC-coupling capacitor comprises two or more capacitors, and the detection circuitry comprises two or more pull-up resistors, two or more second resistors to form a voltage divider with the two or more pull-up resistors, and two or more particular resistors connected in parallel with the two or more second AC-coupling capacitors to provide a DC path around the second AC-coupling capacitors during a detect mode.

In one example, the voltage divider causes a signal to be generated to enable the pulldown relay circuitry in response to detection of the pulldown voltage.

In one example, at least a portion of one of the detection circuitry and pulldown relay circuitry is provided off of a chip of the redriver device.

In one example, the detection circuitry and the pulldown relay circuitry are provided on-chip of the redriver device.

One or more embodiments may provide a method, a system, a machine readable storage, a machine readable medium, and an apparatus including AC-coupled redriver circuitry to receive, at input pins, signals from a first endpoint device on a link, amplify the received signals, and forward the amplified signals on output pins. Detection circuitry can be provided to detect DC pulldown voltages on the output pins corresponding to termination of a second endpoint device on the link. Pulldown relay circuitry can be provided to generate an emulated pulldown voltage corresponding to a receiver detection state in response to detection of an instance of the pulldown voltage, where the pulldown voltage is generated on the input pins to be detected by the first endpoint device within the receiver detection state.

One or more embodiments may provide a system including a DC-coupled first device and an AC-coupled redriver connected to the first device on a differential link. The redriver can include detection circuitry to detect a second device to communicate with the first device using the link, where the detection circuitry detects a pulldown voltage indicating presence of the second device, and pulldown relay circuitry to generate an emulated version of the pulldown voltage, in response to detection of the pulldown voltage, for presentation to the first device on the link. The emulated version of the pulldown voltage can be a DC voltage identifiable by the first device to determine that the second device is present.

In one example, the first device comprises state machine logic to determine whether the second device is present during a receiver detect state and the receiver detect state is one of a plurality of link configuration states.

In one example, the state machine logic is further to initialize the link for high speed communication between the first and second devices.

In one example, the system also includes the second device.

In one example, the second device is hot pluggable.

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the foregoing specification, a detailed description has been given with reference to specific exemplary embodiments. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense. Furthermore, the foregoing use of embodiment and other exemplarily language does not necessarily refer to the same embodiment or the same example, but may refer to different and distinct embodiments, as well as potentially the same embodiment.

What is claimed is:

1. An apparatus comprising:
   a redriver device to receive signals from a first device on first pins of the redriver and forward the signals on second pins of the redriver to a second device on a differential link, wherein the redriver device comprises an AC-coupled redriver and each of the first and second devices comprise DC-coupled devices;
  detection circuitry to detect presence of the second device on the link, wherein detecting the presence of the second device comprises detecting a pulldown voltage on the second pins generated from termination of the second device on the link; and
  pulldown relay circuitry to generate an emulated version of the pulldown voltage of the second device on the first pins using a voltage source of the redriver device in response to detecting presence of the second device on the link, wherein the emulated version of the pulldown voltage identifies the presence of the second device on the link to the first device,
  wherein the emulated version of the pulldown voltage is generated with characteristics defined in a interconnect protocol to cause the first device to transition from a receiver detect state defined in a link state machine of the interconnect protocol to a transmitting link state defined in the link state machine, and the redriver device is to detect signaling within the active link state and disable the pulldown relay circuitry to allow the redriver device to forward the signals from the first device to the second device during the transmitting link state.

2. The apparatus of claim 1, wherein the emulated voltage corresponds to a voltage identifiable by the first device to determine that the second device is present on the link.

3. The apparatus of claim 2, wherein the characteristics of the emulated voltage comprise amplitude and duration of the voltage.

4. The apparatus of claim 1, wherein the transmitting link state comprises a link training state defined in the link state machine, and the emulated voltage is to cause a transition from the receiver detect link state directly to the link training state as defined in the link state machine.

5. The apparatus of claim 4, wherein the link training state comprises one of a set of link training states preceding entry into an active link state.

6. The apparatus of claim 4, wherein the signals from the first device to the second device during the transmitting link state comprise training sequences.

7. The apparatus of claim 1, wherein the redriver device interrupts electrical propagation of the pulldown voltage from the second device to the first device on the link.

8. The apparatus of claim 1, wherein each of the pulldown voltage and the emulated pulldown voltage comprise DC voltages.

9. The apparatus of claim 8, wherein the emulated pulldown voltage comprises a voltage pulse having a corresponding time constant.

10. The apparatus of claim 8, wherein the emulated pulldown voltage comprises a substantially steady DC signal.

11. The apparatus of claim 1, further comprising a first AC-coupling capacitor on a receive side of the redriver and a second AC-coupling capacitor on a transmit side of the redriver.

12. The apparatus of claim 11, wherein at least one of the first and second AC-coupling capacitors is integrated in the redriver device.

13. The apparatus of claim 11, wherein the pulldown relay circuity comprises two or more pulldown resistors to generate the voltage and corresponding switches to enable generation of the emulated pulldown voltage in response to the detection of the pulldown voltage of the second device using the detection circuitry.

14. The apparatus of claim 13, wherein the pulldown relay circuity is coupled to the detection circuitry.

15. The apparatus of claim 11, wherein the second AC-coupling capacitor comprises two or more capacitors, and the detection circuitry comprises two or more pull-up resistors, two or more second resistors to form a voltage divider with the two or more pull-up resistors, and two or more particular resistors connected in parallel with the two or more second AC-coupling capacitors to provide a DC path around the second AC-coupling capacitors during a detect mode.

16. The apparatus of claim 15, wherein the voltage divider causes a signal to be generated to enable the pulldown relay circuitry in response to detection of the pulldown voltage.

17. The apparatus of claim 1, wherein at least a portion of one of the detection circuitry and pulldown relay circuitry is provided off of a chip of the redriver device.

18. The apparatus of claim 1, wherein the detection circuitry and the pulldown relay circuitry are provided on-chip of the redriver device.

19. An apparatus comprising:
  AC-coupled redriver circuitry to:
    receive, at input pins, signals from a first endpoint device on a link,
    amplify the received signals, and
    forward the amplified signals on output pins to a second endpoint device on the link, wherein each of the first and second devices comprise DC-coupled devices;
  detection circuitry to detect a DC pulldown voltage on the output pins corresponding to termination of the second endpoint device on the link; and
  pulldown relay circuitry to generate an emulated pulldown voltage corresponding to a receiver detection state in response to detection of an instance of the pulldown voltage, wherein the pulldown voltage is generated on the input pins to be detected by the first endpoint device within the receiver detection state, wherein the pulldown voltage emulates the DC pulldown voltage to identify the termination of the second endpoint device on the link to the first endpoint device,
  wherein the emulated version of the pulldown voltage is generated with characteristics defined in a interconnect protocol to cause the first device to transition from a detect state defined in a link state machine of the interconnect protocol to a transmitting link state defined in the link state machine, and the redriver device is to detect signaling within the active link state and disable the pulldown relay circuitry to allow the redriver device to forward the signals from the first device to the second device during the transmitting link state.

20. A system comprising:
  a DC-coupled first device; and
  an AC-coupled redriver connected to the first device on a differential link, the redriver comprising:
    first pins to connect to the DC-coupled first device on the link;
    second pins to connect to a second device on the link;
    detection circuitry to detect termination of the second device on-the link, wherein the detection circuitry detects a pulldown voltage on the second pins generated by the termination of the second device; and
    pulldown relay circuitry to generate an emulated version of the pulldown voltage on the first pins, in response to detection of the pulldown voltage, for presentation to the first device on the link, wherein the emulated version of the pulldown voltage comprises a DC voltage identifiable by the first device to determine that the second device is present, the emulated version of the pulldown voltage is generated with characteristics defined in a interconnect protocol to cause the first device to transition from a detect state defined in a link state machine of the interconnect protocol to a transmitting link state defined in the link state machine, and the redriver device is to detect signaling within the active link state and disable the pulldown relay circuitry to allow the redriver device to forward the signals from the first device to the second device during the transmitting link state.

21. The system of claim 20, wherein the first device comprises state machine logic to determine whether the second device is present during a receiver detect state and the receiver detect state is one of a plurality of link configuration states.

22. The system of claim 21, wherein the state machine logic is further to initialize the link for high speed communication between the first and second devices.

23. The system of claim 20, further comprising the second device.

24. The system of claim 20, wherein the second device is hot pluggable.

* * * * *